United States Patent
Cao et al.

(10) Patent No.: US 12,100,715 B2
(45) Date of Patent: Sep. 24, 2024

(54) ARRAY SUBSTRATE, DISPLAY, AND TERMINAL DEVICE

(71) Applicant: HUAWEI TECHNOLOGIES CO., LTD., Guangdong (CN)

(72) Inventors: Huajun Cao, Shenzhen (CN); Guozhong Ma, Shenzhen (CN); Yukun Guo, Beijing (CN); Yong Lu, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 869 days.

(21) Appl. No.: 17/158,664

(22) Filed: Jan. 26, 2021

(65) Prior Publication Data

US 2021/0151474 A1 May 20, 2021

Related U.S. Application Data

(63) Continuation of application No. PCT/CN2020/072884, filed on Jan. 17, 2020.

(30) Foreign Application Priority Data

Jan. 30, 2019 (CN) .................. 201910093015.X

(51) Int. Cl.
*H01L 27/12* (2006.01)
*H01L 23/10* (2006.01)
(Continued)

(52) U.S. Cl.
CPC .......... *H01L 27/1255* (2013.01); *H01L 23/10* (2013.01); *H01Q 21/00* (2013.01);
(Continued)

(58) Field of Classification Search
CPC .......... H01Q 1/24; H01Q 1/241; H01Q 1/243; H01Q 21/00; H01Q 1/38; H01Q 1/422;
(Continued)

(56) References Cited

U.S. PATENT DOCUMENTS

2014/0080411 A1 3/2014 Konanur et al.
2014/0125533 A1* 5/2014 Shi .................... H01Q 1/44
  29/601
(Continued)

FOREIGN PATENT DOCUMENTS

CN 101308266 A 11/2008
CN 102479995 A 5/2012
(Continued)

OTHER PUBLICATIONS

Office Action issued in Chinese Application No. 201910093015.X on Jun. 11, 2020, 18 pages (with English translation).
(Continued)

*Primary Examiner* — Thai Pham
(74) *Attorney, Agent, or Firm* — Fish & Richardson P.C.

(57) ABSTRACT

Example array substrates are provided. One example array substrate includes an underlying substrate, an antenna and a component layer, where the antenna and the component layer are located on a same side of the underlying substrate, where the component layer and the antenna are disposed at intervals, where the component layer includes a plurality of metal laminates and a plurality of dielectric laminates that are stacked, and where the plurality of metal laminates and the plurality of dielectric laminates are alternately disposed to form a plurality of thin film transistors.

15 Claims, 10 Drawing Sheets

(51) Int. Cl.
  *H01Q 1/38* (2006.01)
  *H01Q 21/00* (2006.01)
  *G02F 1/1368* (2006.01)
  *H01L 25/16* (2023.01)
  *H10K 59/12* (2023.01)

(52) U.S. Cl.
  CPC .......... *G02F 1/1368* (2013.01); *H01L 25/167* (2013.01); *H10K 59/12* (2023.02)

(58) Field of Classification Search
  CPC ... H01Q 1/425; H01L 27/124; H01L 27/1248; H01L 27/1251; H01L 27/1255; H01L 23/58; H04M 1/026; H04M 1/0266
  See application file for complete search history.

(56) References Cited

U.S. PATENT DOCUMENTS

| | | | | |
|---|---|---|---|---|
| 2016/0329363 | A1* | 11/2016 | He | H01L 27/1262 |
| 2019/0237849 | A1* | 8/2019 | Misaki | H01L 27/1288 |

FOREIGN PATENT DOCUMENTS

| | | | | |
|---|---|---|---|---|
| CN | 104485334 | A | | 4/2015 |
| CN | 106950748 | A | | 7/2017 |
| CN | 107067969 | A | * 8/2017 | ............... G09F 9/00 |
| CN | 109786396 | A | | 5/2019 |
| KR | 20170124523 | A | | 11/2017 |
| WO | 2011022101 | A2 | | 2/2011 |
| WO | 2018192401 | A1 | | 10/2018 |

OTHER PUBLICATIONS

PCT International Search Report and Written Opinion issued in International Application No. PCT/CN2020/072884 on Apr. 24, 2020, 12 pages (partial English translation).

Extended European Search Report issued in European Application No. 19856672.1 on Sep. 1, 2021, 14 pages.

Office Action issued in Korean Application No. 2021-7002463 on Jan. 7, 2022, 15 pages (with English translation).

* cited by examiner

ARRAY SUBSTRATE, DISPLAY, AND TERMINAL DEVICE

CROSS-REFERENCE TO RELATED APPLICATIONS

This application is a continuation of International Application No. PCT/CN2020/072884, filed on Jan. 17, 2020, which claims priority to Chinese Patent Application No. 201910093015.X, filed on Jan. 30, 2019. The disclosures of the aforementioned applications are hereby incorporated by reference in their entireties.

TECHNICAL FIELD

Embodiments of this application relate to the field of terminal technologies, and in particular, to an array substrate, a display, and a terminal device.

BACKGROUND

With continuous development of the information era, terminal devices such as mobile phones have quickly become important communications tools for communication between people because of advantages such as convenience and portability. As a component for receiving and transmitting a signal in a mobile phone, an antenna plays a key role in ensuring communication quality and implementing instant messaging. Against the backdrop of an increasing screen-to-body ratio, an antenna is prone to have a problem of insufficient antenna clearance space in a conventional layout, and antenna performance is relatively poor.

SUMMARY

Embodiments of this application provide an array substrate. The array substrate is integrated with an antenna, so that the antenna can directly perform communication by using space above a screen of the terminal device. Clearance space is relatively large during communication, and therefore communication quality is relatively high. The embodiments of this application further provide a display and a terminal device.

According to a first aspect, an array substrate is provided. The array substrate may be applied to a display of a terminal device. The array substrate includes an underlying substrate, and an antenna and a component layer that are located on a same side of the underlying substrate. The antenna is configured to receive and transmit a signal. The component layer is configured to control a displayed picture of the display. The component layer and the antenna are disposed at intervals. To be specific, a gap is formed between the component layer and the antenna, and the gap can isolate the component layer from the antenna, to reduce interference of the component layer on signal receiving and transmission of the antenna.

In this embodiment, the array substrate includes the component layer and the antenna. Therefore, the display that uses the array substrate is further integrated with an antenna communication function while implementing a basic display function. Therefore, the display has a high integration degree, and this is conducive to miniaturization, lightness, and thinness of the terminal device. Because the antenna is integrated into the array substrate, the antenna can directly perform communication by using space above the display, so that the antenna has plenty of clearance space during communication, and communication quality of the antenna is relatively desirable.

The component layer includes a plurality of metal laminates and a plurality of dielectric laminates that are stacked. The metal laminates and the dielectric laminates are alternately stacked to form a plurality of thin film transistors. At least one dielectric laminate is disposed between any two adjacent metal laminates. The dielectric laminate located between the two metal laminates can electrically isolate the two metal laminates from each other. The metal laminate and the dielectric laminate are patterned laminates, so that the plurality of metal laminates and the plurality of dielectric laminates that are stacked jointly form the plurality of thin film transistors. The plurality of thin film transistors are arranged in an array.

The antenna includes a first metal layer. The first metal layer includes M metal sublayers, where M is an integer greater than or equal to 2. A metal laminate quantity of the plurality of metal laminates of the component layer is greater than or equal to M. The M metal sublayers are sequentially stacked on the underlying substrate. The M metal sublayers include a $j^{th}$ metal sublayer and a $(j+1)^{th}$ metal sublayer. A distance between the $j^{th}$ metal sublayer and the underlying substrate is less than a distance between the $(j+1)^{th}$ metal sublayer and the underlying substrate, where j is an integer greater than or equal to 1. In other words, the $j^{th}$ metal sublayer is located between the underlying substrate and the $(j+1)^{th}$ metal sublayer.

Each metal sublayer corresponds to one of the plurality of metal laminates. In other words, the plurality of metal laminates have a metal laminate corresponding to each metal sublayer. A distance between a metal laminate corresponding to the $j^{th}$ metal sublayer and the underlying substrate is less than a distance between a metal laminate corresponding to the $(j+1)^{th}$ metal sublayer and the underlying substrate. That is, the metal laminate corresponding to the $j^{th}$ metal sublayer is located between the underlying substrate and the metal laminate corresponding to the $(j+1)^{th}$ metal sublayer.

Both a material and a thickness of each metal sublayer are the same as those of a corresponding metal laminate. For example, both a material and a thickness of the $j^{th}$ metal sublayer are the same as those of the metal laminate corresponding to the $j^{th}$ metal sublayer, and both a material and a thickness of the $(j+1)^{th}$ metal sublayer are the same as those of the metal laminate corresponding to the $(j+1)^{th}$ metal sublayer.

In this embodiment, both a material and a thickness of the metal sublayer of the antenna are the same as those of the metal laminate that is on the component layer and that corresponds to the metal sublayer. The metal sublayer and the metal laminate also have a same process sequence, and are same-layer structures that are synchronously formed in a same process, that is, each metal sublayer and a corresponding metal laminate are synchronously formed in a same process.

In this embodiment, each metal sublayer of the first metal layer of the antenna is synchronously formed in a process of the component layer, that is, some or all structures of the antenna and the component layer are synchronously produced. Therefore, time consumed in an independent technique required for producing the antenna is greatly reduced, and overall production time of the array substrate is shorter and costs are lower.

Optionally, the metal sublayers of the antenna and some metal laminates of the component layer may be synchronously formed. A quantity of the metal sublayers is less than a quantity of the metal laminates of the component layer. In another implementation, alternatively, the metal sublayers of the antenna and all the metal laminates of the component layer may be synchronously formed. The quantity of the metal sublayers is the same as the quantity of the metal laminates of the component layer. The quantity of the metal sublayers of the antenna may be set based on a thickness required by performance of the antenna.

Optionally, the array substrate further includes a baffle plate. The baffle plate is located between the component layer and the antenna. The component layer and the antenna may be spaced from each other by the baffle plate. A specific structure of the baffle plate is not strictly limited in this application. For example, the baffle plate may be partially or completely disposed around the antenna to space the antenna from the component layer. The baffle plate may be made of an insulated dielectric material. For example, the dielectric material may be a material such as silicon nitride, silicon oxide, or polyacrylate. The baffle plate is configured to space the antenna from the component layer, to reduce interference of the component layer on signal receiving and transmission of the antenna.

In another embodiment, the antenna and the component layer are spaced by air. In this case, no additional baffle plate structure needs to be added to the array substrate, thereby simplifying a technique procedure of the array substrate and reducing costs of producing the array substrate.

With reference to the first aspect, in a first possible implementation, the antenna further includes a second metal layer. The second metal layer is stacked on a side that is of the first metal layer and that is away from the underlying substrate, that is, the second metal layer is located above the first metal layer.

In this embodiment, because a thickness of each of the plurality of metal laminates is limited, a thickness of the first metal layer is limited. The second metal layer continues to be stacked on the first metal layer, so that a thickness of the antenna can be increased. In this way, a total thickness of the antenna meets a receiving and transmission performance requirement, and bandwidth of the antenna is increased and thermal resistance of the antenna is reduced.

Because a processing time of the first metal layer and a processing time of the metal laminate on the component layer are synchronous, time consumed in a technique of the antenna is only time consumed in a technique for processing the second metal layer. Therefore, overall processing time of the antenna can be reduced, and costs of producing the antenna can be reduced.

The second metal layer is formed by using a deposition technique. In this embodiment, forming the plurality of metal laminates on the component layer by using the deposition technique is a conventional method. A technique that is the same as that of the component layer is used for the second metal layer, so that the second metal layer can be processed by using a device that produces the component layer. Another new device does not need to be introduced in a production process of the antenna, so that costs of producing the array substrate can be reduced.

Materials of the M metal sublayers on the first metal layer change along with materials of the metal laminates of the component layer. The materials of the M metal sublayers may be the same or may be different. A material of the second metal layer may be the same as or different from a material of the first metal layer. The material of the second metal layer may be aluminum, silver, or magnesium.

In another embodiment, the antenna may alternatively not include the second metal layer, that is, the antenna includes the first metal layer. When the antenna does not include the second metal layer, no additional technique needs to be used to form the second metal layer, and time consumed in a technique for processing the antenna and time consumed in a technique for processing the metal laminate of the component layer are synchronous, thereby reducing overall time consumed in the technique for forming the antenna.

With reference to the first aspect or the first possible implementation of the first aspect, in a second possible implementation, the plurality of metal laminates include a gate electrode layer, a source/drain electrode layer, and a pixel electrode layer that are sequentially stacked on the underlying substrate. At least one dielectric laminate is disposed between the source/drain electrode layer and the gate electrode layer. At least one dielectric laminate is disposed between the pixel electrode layer and the source/drain electrode layer. In this embodiment, the thin film transistor is a single-gate structure. In this case, the plurality of metal laminates are at least three metal laminates.

The metal laminate corresponding to the $j^{th}$ metal sublayer is the gate electrode layer, and the metal laminate corresponding to the $(j+1)^{th}$ metal sublayer is the source/drain electrode layer or the pixel electrode layer. In this case, the first metal layer includes two metal sublayers or three metal sublayers.

Alternatively, the metal laminate corresponding to the $j^{th}$ metal sublayer is the source/drain electrode layer, and the metal laminate corresponding to the $(j+1)^{th}$ metal sublayer is the pixel electrode layer. In this case, the first metal layer includes two metal sublayers.

In this embodiment, the component layer is processed by using a mature technique, and the first metal layer of the antenna is synchronously formed by using the mature technique. Therefore, the first metal layer can have higher product precision and a higher yield. In addition, in this embodiment, a process of an existing mature technique does not need to be greatly changed in a production process of the antenna, and the antenna can be synchronously formed by adjusting only a part of a mask structure in a process of forming the component layer. Therefore, difficulty in technique improvement of the array substrate is relatively low and production costs are relatively low.

With reference to the first aspect or the first possible implementation of the first aspect, in a third possible implementation, the plurality of metal laminates include a first gate electrode layer, a second gate electrode layer, a source/drain electrode layer, and a pixel electrode layer that are sequentially stacked on the underlying substrate. At least one dielectric laminate is disposed between the second gate electrode layer and the first gate electrode layer. At least one dielectric laminate is disposed between the source/drain electrode layer and the second gate electrode layer. At least one dielectric laminate is disposed between the pixel electrode layer and the source/drain electrode layer. In this embodiment, the thin film transistor is a double-gate structure. In this case, the plurality of metal laminates are at least four metal laminates.

The metal laminate corresponding to the $j^{th}$ metal sublayer is the first gate electrode layer, and the metal laminate corresponding to the $(j+1)^{th}$ metal sublayer is the second gate electrode layer, the source/drain electrode layer, or the pixel electrode layer. In this case, the first metal layer may include two metal sublayers, three metal sublayers, or four metal sublayers.

Alternatively, the metal laminate corresponding to the $j^{th}$ metal sublayer is the source; drain electrode layer, and the metal laminate corresponding to the $(j+1)^{th}$ metal sublayer is the second gate electrode layer or the pixel electrode layer. In this case, the first metal layer may include two metal sublayers or three metal sublayers.

Alternatively, the metal laminate corresponding to the $j^{th}$ metal sublayer is the source/drain electrode layer, and the metal laminate corresponding to the metal sublayer is the pixel electrode layer. In this case, the first metal layer includes two metal sublayers.

In this embodiment, a dual-gate structure is used as the thin film transistor. On one hand, the thin film transistor controls the display to display a picture faster, thereby improving quality of the display. On the other hand, the dual-gate structure increases a metal laminate quantity of the plurality of metal laminates, thereby increasing options of each metal sublayer on the first metal layer and enabling the first metal layer to be thicker after the first metal layer is formed.

With reference to the first aspect or the first possible implementation of the first aspect, in a fourth possible implementation, the array substrate includes a cable layer and at least one antenna array. The antenna array includes a plurality of antennas. Because the antenna array includes a plurality of antennas, the antenna array may form a multiple-input multiple-output (MIMO) system, to increase a channel capacity and improve communication quality.

The cable layer, the antenna array, and the component layer are all located on a same side of the underlying substrate, and the antenna array and the cable layer are disposed at intervals, that is, a gap is formed between the antenna array and the cable layer. One end of a cable on the cable layer is connected to the thin film transistor on the component layer, and the other end of the cable is configured to connect to another component, so that the component is connected to the thin film transistor. The cable layer and the antenna array are disposed at intervals, to prevent a signal transmitted on the cable layer from interfering signal receiving and transmission of the antenna in the antenna array.

The array substrate includes a display area and a non-display area. The non-display area is disposed around the display area. Both the cable layer and the antenna array are located in the non-display area. The component layer is located in the display area.

The cable layer includes a cable exit portion and a connecting portion. The connecting portion is connected to the thin film transistor on the component layer, and the cable exit portion is configured to connect to another component. One end of the connecting portion is connected to the thin film transistor on the component layer, and the other end of the connecting portion is connected to the cable exit portion. For example, the cable exit portion is configured to connect to a printed circuit board. The printed circuit board may be a flexible printed circuit board, so that the printed circuit board can be bent and then connected to a main board located on a side that is of the array substrate and that is away from the cable layer (that is, located below the display). The printed circuit board may be fastened to the cable exit portion in a binding manner.

The cable exit portion of the cable layer is located between the component layer and a first edge of the underlying substrate. The antenna array is located between the component layer and the first edge. The first edge is a top edge or a bottom edge of the underlying substrate, that is, the first edge is not a lateral edge of the underlying substrate. The underlying substrate further includes two lateral edges located between the top edge and the bottom edge.

In this embodiment, both the cable exit portion of the cable layer and the antenna array are located between the component layer and the first edge. In this way, the cable exit portion and the antenna array share space in a lateral edge direction of the underlying substrate (an extension direction of the lateral edge of the underlying substrate), and a width of the non-display area of the array substrate is reduced, to help increase a screen-to-body ratio and narrow a frame of the display and the terminal device.

With reference to the fourth possible implementation of the first aspect, in a fifth possible implementation, along an extension direction of the first edge, the at least one antenna array is located on one side of the cable exit portion or on two sides of the cable exit portion. The underlying substrate further includes a first lateral edge and a second lateral edge that are disposed opposite to each other. Both the first lateral edge and the second lateral edge are lateral edges of the underlying substrate. The first lateral edge and the second lateral edge are located between the top edge and the bottom edge.

In this embodiment, the antenna array is arranged in idle space on one side or two sides of the cable exit portion, so that idle space of the array substrate is fully utilized, space utilization of the array substrate is improved, and an integration degree of the array substrate is relatively high. Both the antenna array and the cable exit portion are located in the extension direction of the first edge, and the antenna array does not need to occupy space between the lateral edge and the component layer, so that a width of the non-display area can be reduced as much as possible, thereby helping improve the screen-to-body ratio and narrow the frame of the terminal device.

Optionally, in the antenna array, a quantity of antennas arranged along the extension direction of the first edge is greater than a quantity of antennas arranged along an extension direction of the lateral edge. The extension direction of the first edge is defined as a width direction, and the extension direction of the lateral edge is defined as a length direction. In the antenna array, a quantity of antennas arranged along the width direction is greater than a quantity of antennas arranged along the length direction.

In this embodiment, on one hand, because the quantity of the antennas arranged in the width direction is greater than the quantity of the antennas arranged in the length direction, this reduces a width of the non-display area and helps narrow the frame of the terminal device. On the other hand, when the terminal device is a mobile phone, a user generally holds a lateral edge of the mobile phone when using the mobile phone, and most of the antennas are arranged in the width direction, to prevent most signals of the antennas from being blocked by a hand of the user, thereby improving signal receiving and transmission performance of the antennas.

With reference to the first aspect or the first possible implementation of the first aspect, in a sixth possible implementation, the array substrate further includes a conductor layer. The conductor layer is located on a side that is of the underlying substrate and that is away from the antenna, and a projection of the conductor layer on the underlying substrate covers a projection of the antenna on the underlying substrate.

In this embodiment, the antenna is disposed on an upper layer of the underlying substrate, the conductor layer is disposed on a lower layer of the underlying substrate, and the conductor layer can form a floor, to improve radiation performance of the antenna. In addition, the projection of the conductor layer on the underlying substrate covers the projection of the antenna on the underlying substrate, so that all signals transmitted by the antenna can use the conductor layer as a reference ground, and transmission quality of the signals is relatively high.

According to a second aspect, this application further provides another array substrate. The array substrate includes an underlying substrate, and an antenna and a component layer that are located on a same side of the underlying substrate. The component layer and the antenna are disposed at intervals. The component layer includes a plurality of metal laminates and a plurality of dielectric laminates that are stacked, and the metal laminates and the dielectric laminates are alternately disposed to form a plurality of thin film transistors. The antenna includes a first metal layer and a second metal layer that are stacked. The first metal layer is located between the underlying substrate and the second metal layer. Both a thickness and a material of the first metal layer are the same as those of any one of the plurality of metal laminates.

In this embodiment, both a thickness and a material of the first metal layer are the same as those of any one of the plurality of metal laminates. The first metal layer and any one of the plurality of metal laminates also have a same process sequence, and are same-layer structures that are synchronously formed in a same process, that is, the first metal layer and any metal laminate are synchronously formed in a same process.

In this embodiment, on one hand, the antenna is integrated into the array substrate, and the antenna can directly perform communication by using space above the display, so that there is plenty of clearance space of the antenna during communication, and communication quality of the antenna is relatively desirable. On the other hand, the antenna includes the two metal layers, and a total thickness of the antenna is increased by the second metal layer, so that the total thickness of the antenna meets a receiving and transmission performance requirement, and bandwidth of the antenna is increased and thermal resistance of the antenna is reduced. The first metal layer and any one of the plurality of metal laminates on the component layer are synchronously formed, to reduce a time consumed in a technique for producing the first metal layer, thereby reducing time consumed in a technique for producing the antenna.

According to a third aspect, this application further provides still another array substrate. The array substrate includes an underlying substrate, and an antenna, a component layer, and a cable layer that are located on a same side of the underlying substrate. The antenna and the cable layer are disposed at intervals, and a cable on the cable layer is connected to a thin film transistor on the component layer. The antenna includes at least two conducting layers. Both a thickness and a material of at least one of the conducting layers are the same as those of a metal laminate on the component layer.

In this embodiment, because the antenna is integrated into the array substrate, all space above the display can be clearance space of the antenna, so that there is plenty of clearance space of the antenna during communication and communication quality of the antenna is relatively desirable. In addition, both a material and a thickness of a metal sublayer of the antenna are the same as those of the metal laminate that is on the component layer and that corresponds to the metal sublayer. In a production procedure, the metal sublayer and the metal laminate are same layer structures synchronously formed by using a same process, that is, some or all of the conducting layers of the antenna and the component layer are synchronously produced. In this way, time consumed in a technique for producing the conducting layer of the antenna is reduced, so that overall production time of the array substrate is shorter and costs are lower. The antenna includes the at least two conducting layers. Therefore, a total thickness of the antenna is relatively large, to meet a receiving and transmission performance requirement of the antenna, and increase bandwidth of the antenna and reduce thermal resistance of the antenna.

In an optional embodiment, the underlying substrate includes a display area, a cable area, and an antenna area. The component layer is located in the display area. The cable layer is located in the cable area. The cable area is located between the display area and a top edge of the underlying substrate. Alternatively, the cable area is located between the display area and a bottom edge of the underlying substrate. The cable area and the antenna area are located in a non-display area.

In this embodiment, the cable area is located between the display area and the top edge or the bottom edge, that is, the cable area located in the non-display area is close to the top edge or close to the bottom edge, to prevent the cable area from being located between the display area and a lateral edge of the underlying substrate, and to reduce a width of the non-display area as much as possible, thereby helping narrow a frame of the terminal device.

The antenna is located in the antenna area. The underlying substrate includes a first lateral edge and a second lateral edge that are disposed opposite to each other. Both the first lateral edge and the second lateral edge are lateral edges of the underlying substrate. The first lateral edge and the second lateral edge are located between the top edge and the bottom edge. The antenna area is located between the cable area and any lateral edge of the underlying substrate. Alternatively, the antenna area is located between the cable area and each lateral edge of the underlying substrate.

In this embodiment, the antenna area is located between the cable area and any lateral edge, or the antenna area is located between the cable area and each lateral edge, that is, the antenna area is arranged on one side of the cable area, or the antenna area is arranged on two sides of the cable area. In this way, the antenna area and the cable area share space in a lateral edge direction, to reduce the width of the non-display area, thereby helping narrow the frame of the terminal device.

According to a fourth aspect, this application further provides a display. The display includes an aligned substrate, a display layer, and the array substrate described above. The aligned substrate is disposed opposite to the array substrate. The display layer is located between the aligned substrate and the array substrate.

In this embodiment, because the display includes the array substrate on which the antenna is integrated into an underlying substrate, the display not only has a display function, but also integrates a communication function of the antenna, thereby improving an integration degree of the display. The antenna can directly perform communication by using space above the display, so that the antenna has plenty of clearance space during communication, and communication quality of the antenna is relatively desirable.

With reference to the fourth aspect, in a first possible implementation, the display includes an insulation layer. The insulation layer is located between the aligned substrate and the antenna.

In this embodiment, the insulation layer not only isolates the aligned substrate from the antenna, but also isolates another metal element from the antenna, to avoid interference of the another metal element on signal receiving and transmission of the antenna. In addition, the insulation layer also performs a function of isolating water vapor and oxygen, to protect the antenna and improve quality of the antenna.

With reference to the fourth aspect or the first possible implementation of the fourth aspect, in a second possible implementation, the display further includes a packaging frame. The packaging frame is connected between the underlying substrate and the aligned substrate. The packaging frame is disposed around the component layer. The display layer is located on an inner side of the packaging frame, and the antenna is located on an outer side of the packaging frame.

In this embodiment, on one hand, the packaging frame performs a function of supporting the aligned substrate. On the other hand, the packaging frame performs a function of isolating external water vapor and oxygen, to prevent water vapor and oxygen from damaging the component layer, thereby improving display quality of the display.

In an optional embodiment, the packaging frame is disposed between the component layer and the antenna. The packaging frame intensifies isolation between the component layer and the antenna, and is more conducive to reduction of interference of the component layer on signal receiving and transmission of the antenna.

The packaging frame in this embodiment and the baffle plate in the foregoing embodiment may be two different components, and are independent of each other. Alternatively, the baffle plate in the foregoing embodiment may be integrated into the packaging frame.

According to a fifth aspect, this application further provides a terminal device. The terminal device includes a housing and the display described above. The display is mounted on the housing.

In this embodiment, the display of the terminal device is integrated with the antenna having a communication function, and the antenna does not need to additionally occupy space of the terminal device, thereby facilitating miniaturization, lightness, and thinness of the terminal device. The antenna is integrated into the array substrate of the display, the antenna can directly perform communication by using space above the display, and there is plenty of clearance space of the antenna during communication, thereby improving communication quality of the terminal device.

BRIEF DESCRIPTION OF DRAWINGS

To describe the technical solutions in the embodiments of this application or in the background more clearly, the following briefly describes the accompanying drawings required for describing the embodiments of this application or the background.

DESCRIPTION OF EMBODIMENTS

The following describes the embodiments of this application with reference to the accompanying drawings in the embodiments of this application.

Figure 1:
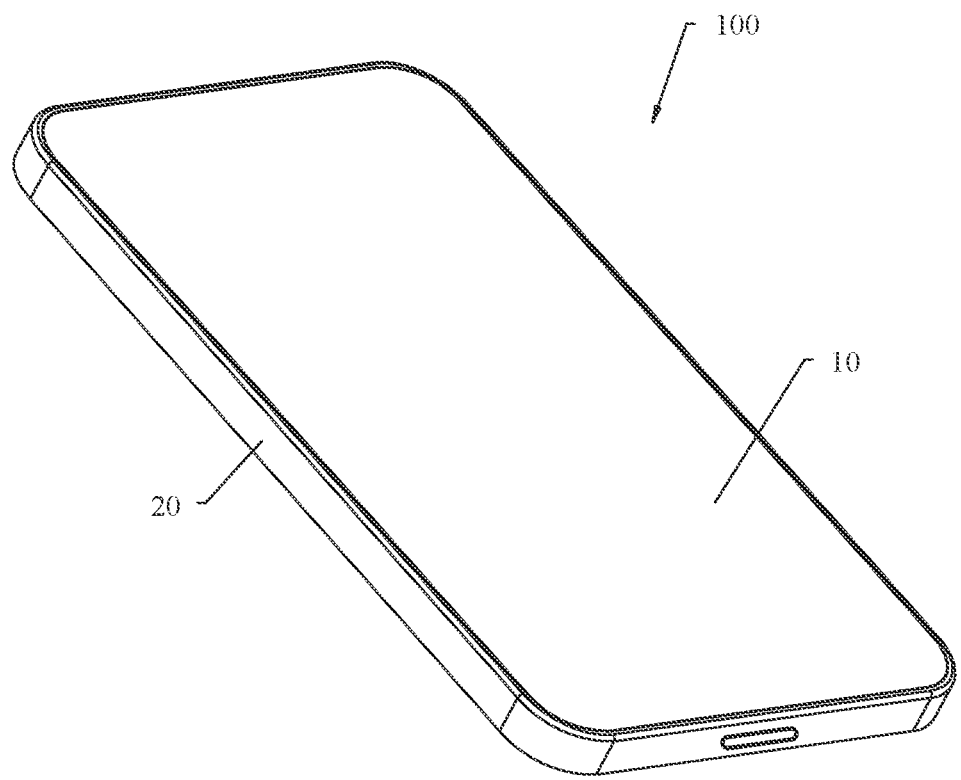
FIG. 1 is a schematic structural diagram of a terminal device according to an embodiment of this application.
Figure 2:
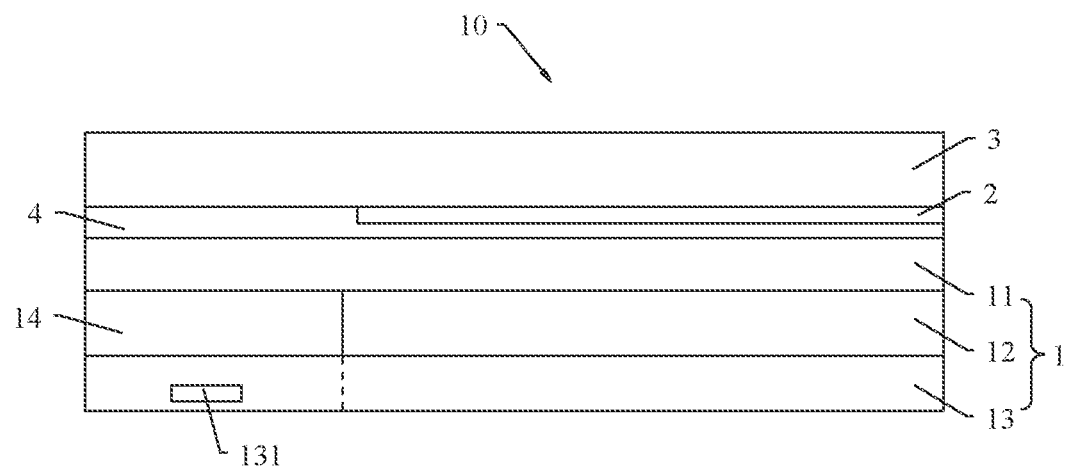
FIG. 2 is a schematic structural diagram of a screen component of the terminal device shown in FIG. 1.

FIG. 1 is a schematic structural diagram of a terminal device according to an embodiment of this application. FIG. 2 is a schematic structural diagram of a screen component of the terminal device shown in FIG. 1. An embodiment of this application provides a terminal device 100. The terminal device 100 may be a device such as a mobile phone, a tablet computer, an electronic reader, a notebook computer, an in-vehicle device, or a wearable device. In this embodiment of this application, an example in which the terminal device 100 is a mobile phone is used for description.

The terminal device 100 includes a screen component 10 and a housing 20. The screen component 10 is mounted on the housing 20. The screen component 10 includes a display 1, a touch layer 2, and a cover glass 3. The touch layer 2 is located between the display 1 and the cover glass 3. Both the cover glass 3 and the touch layer 2 are located on a light emitting side of the display 1. The display 1 is configured to display a picture. The touch layer 2 is configured to sense a touch operation of a contact. The contact may be a finger of a user, a stylus, or the like. In this embodiment of this application, the touch layer 2 is located between the display 1 and the cover glass 3, so that a distance between the touch layer 2 and the contact can be reduced, thereby improving touch sensing performance. In another embodiment, the touch layer 2 may be alternatively integrated into the display 1. For example, the display 1 may be an in-cell touch display, so that the screen component 10 is lighter and thinner. A specific location of the touch layer 2 is not strictly limited in this embodiment of this application.

In this embodiment of this application, the screen component 10 includes the touch layer 2. In this case, the screen component 10 is a touchscreen. For example, when the terminal device 100 is a mobile phone, a tablet computer, or an in-vehicle device, the screen component 10 is a touchscreen including the touch layer 2. In another embodiment, when the terminal device 100 or the screen component 10 does not need a touch function, the screen component 10 may alternatively not include the touch layer 2. For example, when the terminal device 100 is a notebook computer, the screen component 10 may not include the touch layer. In this embodiment of this application, an example in which the screen component 10 is a touchscreen is used for description.

An optical adhesive layer 4 is disposed between the touch layer 2 and the display 1. The optical adhesive layer 4 is connected to the touch layer 2 and the display 1. The optical adhesive layer 4 is generally made of an optically clear adhesive (OCA) material. When a user uses the terminal device 100, the cover glass 3 faces the user. The cover glass 3 has functions such as anti-shock, scratch resistance, oil stain resistance, anti-fingerprint, and transmittance enhancing. The cover glass 3 protects the touch layer 2 on one hand, and may print different colors, patterns, and signs on the other hand, to decorate and beautify the screen component 10.

The display 1 may be any product or component that has a display function. The display 1 may include any one of the following plurality of panels, for example, a light emitting diode (LED) panel, a liquid crystal display (LCD) panel, an organic light-emitting diode (OLED) panel, a quantum dot light-emitting diode (QLED) panel, or a micro light-emitting diode (uLED) panel.

In an embodiment of this application, the display 1 includes an aligned substrate 11, a display layer 12, and an array substrate 13. The aligned substrate 11 and the array substrate 13 are disposed opposite to each other. The display layer 12 is located between the aligned substrate 11 and the array substrate 13. The display layer 12 is configured to display a picture. In a first embodiment provided in this application, an example in which a display panel of the display 1 is an organic light-emitting diode panel is used for description. In this case, the display layer 12 is an organic layer.

Optionally, the array substrate 13 includes a display area and a non-display area. The non-display area is disposed around the display area. The display area of the array substrate 13 corresponds to a display area of the display 1. The non-display area of the array substrate 13 corresponds to a non-display area of the display 1. The display layer 12 is located above the display area of the array substrate 13. An antenna 131 is disposed in the non-display area of the array substrate 13. The antenna 131 is configured to receive and transmit a signal. That is, the display 1 includes the built-in antenna 131. The antenna 131 built in the display 1 may be used as a network signal transceiver antenna, to improve Internet access experience when a user uses the terminal device 100. The antenna 131 built in the display 1 may be further used as a call antenna, to improve call quality of the terminal device 100.

The aligned substrate 11 may be an upper-layer cover plate that packages the display layer 12. A projection of the aligned substrate 11 on the array substrate 13 covers a projection of the display layer 12 on the array substrate 13. In this embodiment, the projection of the aligned substrate 11 on the array substrate 13 covers a projection of the antenna 131 on the array substrate 13. The aligned substrate 11 can perform a function of protecting the display layer 12 and the antenna 131. The antenna 131 and the touch layer 2 are arranged in a staggered manner. That is, a projection of the touch layer 2 on the array substrate 13 does not overlap the projection of the antenna 131 on the array substrate 13. The antenna 131 and the touch layer 2 are arranged in a staggered manner, to prevent the touch layer 2 from blocking a signal radiation path of the antenna 131, thereby improving performance of the antenna 131.

Further, the display 1 includes an insulation layer 14. The insulation layer 14 is located between the aligned substrate 11 and the antenna 131. In this embodiment, an example in which the insulation layer 14 covers the antenna 131 is used for description. Silicon nitride or an organic material may be used as the insulation layer 14. The organic material includes, but is not limited only to, a poly acrylate material.

In this embodiment, the insulation layer 14 not only isolates the aligned substrate 11 from the antenna 131, but also isolates another metal element from the antenna 131, to avoid interference of the another metal element on signal receiving and transmission of the antenna 131. In addition, the insulation layer 14 also performs a function of isolating water vapor and oxygen, to protect the antenna 131 and improve quality of the antenna 131.

Figure 3:
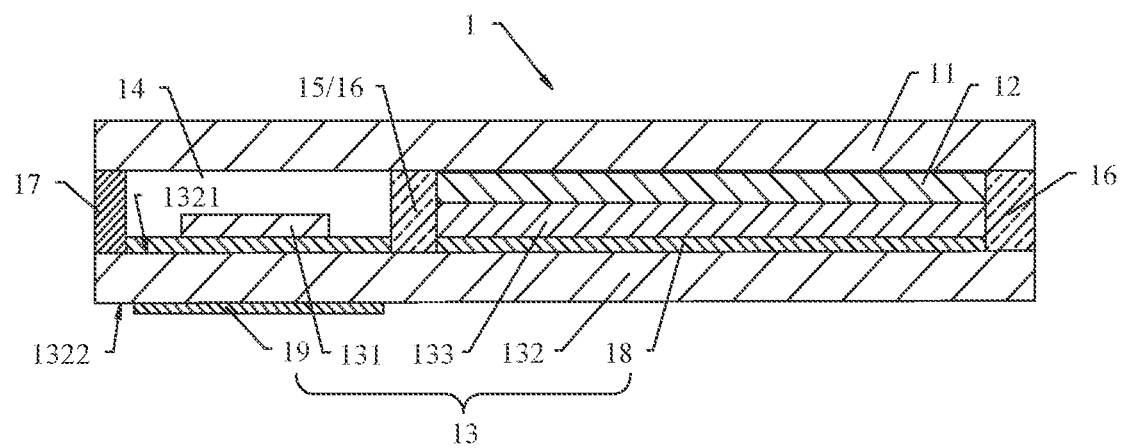
FIG. 3 is a schematic structural diagram of a display of the screen component shown in FIG. 2 according to a first embodiment.

Refer to both FIG. 2 and FIG. 3. FIG. 3 is a schematic structural diagram of the display 1 of the screen component 10 shown in FIG. 2 according to a first embodiment. Further, the array substrate 13 includes an underlying substrate 132, and the antenna 131 and a component layer 133 located on a same side of the underlying substrate 132. The display layer 12 is located between the component layer 133 and the aligned substrate 11. The component layer 133 is configured to control a displayed picture of the display 1. The component layer 133 may include a plurality of thin-film transistors (TFT).

In this embodiment, the array substrate 13 includes the component layer 133 and the antenna 131. Therefore, the display 1 that uses the array substrate 13 is further integrated with a communication function of the antenna 131 while performing a basic display function. Therefore, the display 1 has a high integration degree, and is conducive to miniaturization, lightness, and thinness of the terminal device 100. Because the antenna 131 is integrated into the array substrate 13, the antenna 131 can directly perform communication by using space above the display 1, so that the antenna 131 has plenty of clearance space during communication, and communication quality of the antenna 131 is relatively desirable.

Further, the component layer 133 and the antenna 131 are disposed at intervals. To be specific, a gap is formed between the component layer 133 and the antenna 131, and the gap can isolate the component layer 133 from the antenna 131, to reduce interference of the component layer 133 on signal receiving and transmission of the antenna 131.

A specific distance exists between the component layer 133 and the antenna 131, to isolate the component layer 133 from the antenna 131. For example, spacing between the component layer 133 and the antenna 131 is greater than or equal to 0.5 millimeter (mm). In this case, there is plenty of gap between the component layer 133 and the antenna 131, and the gap reduces interference of the component layer 133 on signal receiving and transmission of the antenna 131.

Further, the array substrate 13 further includes a baffle plate. A baffle plate 15 is located between the component layer 133 and the antenna 131. The component layer 133 and the antenna 131 may be spaced from each other by using the baffle plate 15. A specific structure of the baffle plate 15 is not strictly limited in this embodiment. For example, the baffle plate 15 may be partially or completely disposed around the antenna 131, to space the antenna 131 from the component layer 133. The baffle plate 15 may be made of an insulated dielectric material. For example, the dielectric material may be a material such as silicon nitride, silicon oxide, or polyacrylate. The baffle plate 15 is configured to space the antenna 131 from the component layer 133, to reduce interference of the component layer 133 on signal receiving and transmission of the antenna 131.

In another implementation, the antenna 131 and the component layer 133 are spaced by air. In this case, no additional baffle plate structure needs to be added to the array substrate 13, thereby simplifying a technique procedure of the array substrate 13 and reducing costs of producing the array substrate 13.

Further, the display 1 further includes a packaging frame 16. The packaging frame 16 is connected between the underlying substrate 132 and the aligned substrate 11. The packaging frame 16 is disposed around the component layer 133. The display layer 12 is located on an inner side of the packaging frame 16, and the antenna 131 is located on an outer side of the packaging frame 16.

In this embodiment, on one hand, the packaging frame 16 can perform a function of supporting the aligned substrate 11. On the other hand, the packaging frame 16 performs a function of isolating external water vapor and oxygen, to prevent water vapor and oxygen from damaging the component layer 133, thereby improving display quality of the display 1. At the same time, the packaging frame 16 is disposed around the component layer 133, so that the component layer 133 is isolated from the antenna 131, thereby reducing interference of the component layer 133 on signal receiving and transmission of the antenna 131. The display layer 12 is located on the inner side of the packaging frame 16, and the antenna 131 is located on the outer side of the packaging frame 16. The packaging frame 16 can also isolate the antenna 131 from the display layer 12, to reduce interference of the display layer 12 on signal receiving and transmission of the antenna 131.

Further, the packaging frame 16 may also be disposed between the component layer 133 and the antenna 131. The packaging frame 16 intensifies isolation between the component layer 133 and the antenna 131, and is more conducive to reduction of interference of the component layer 133 on signal receiving and transmission of the antenna 131. In this embodiment of this application, the packaging frame 16 and the baffle plate 15 may be two different components, or the baffle plate 15 may be integrated into the packaging frame 16. In the first embodiment of this application, an example in which the baffle plate 15 is integrated into the packaging frame 16 is used for description.

Further, a distance between the underlying substrate 132 and a side that is of the antenna 131 and that is away from the underlying substrate 132 is less than a distance between the underlying substrate 132 and a side that is of the aligned substrate 11 and that is close to the underlying substrate 132. That is, the antenna 131 is located below the aligned substrate 11. In this case, the display 1 may be a flexible display, or may be a rigid display. In another embodiment, when the display 1 is a flexible display, the distance between the underlying substrate 132 and the side that is of the antenna 131 and that is away from the underlying substrate 132 may be greater than the distance between the underlying substrate 132 and the side that is of the aligned substrate 11 and that is close to the underlying substrate 132. In addition, the distance between the underlying substrate 132 and the side that is of the antenna 131 and that is away from the underlying substrate 132 is less than a distance between the underlying substrate 132 and a side that is of the cover glass 3 and that is close to the underlying substrate 132. In this case, the screen component 10 can form an odd-form screen.

Further, the display 1 further includes a packaging member 17. The packaging member 17 is located on a side that is of the underlying substrate 132 and that is away from the component layer 133. The packaging member 17 and the aligned substrate 11 jointly enclose the antenna 131, to prevent dust or other foreign matters from entering the antenna 131 and interfering with receiving and transmission performance of the antenna 131.

Optionally, the array substrate 13 includes a buffer layer 18. The buffer layer 18 is located between the underlying substrate 132 and the component layer 133. The buffer layer 18 can intensify adhesion between the component layer 133 and the underlying substrate 132, to prevent the component layer 133 from falling off from the underlying substrate 132, thereby improving quality of the array substrate 13. As shown in FIG. 3, the buffer layer 18 is also disposed between the antenna 131 and the underlying substrate 132. The buffer layer 18 can also intensify adhesion between the antenna 131 and the underlying substrate 132 and enhance stability of the antenna 131 and the underlying substrate 132, thereby improving quality of the array substrate 13.

Further, the array substrate 13 further includes a conductor layer 19. The conductor layer 19 is located on a side that is of the underlying substrate 132 and that is away from the antenna 131, and a projection of the conductor layer 19 on the underlying substrate 132 covers a projection of the antenna 131 on the underlying substrate 132. The underlying substrate 132 includes a first surface 1321 and a second surface 1322 that are disposed opposite to each other. The antenna 131 is attached to the first surface 1321. The conductor layer 19 is attached to the second surface 1322. A thickness of the conductor layer 19 may range from 1 micrometer (um) to 100 micrometers. For example, the thickness of the conductor layer 19 may be 10 micrometers. A range "from A to B" includes endpoints "A" and "B".

In this embodiment, the antenna 131 is disposed at an upper layer of the underlying substrate 132, the conductor layer 19 is disposed below the underlying substrate 132, and the conductor layer 19 can form a floor, to improve radiation performance of the antenna 131. In addition, the projection of the conductor layer 19 on the underlying substrate 132 covers the projection of the antenna 131 on the underlying substrate 132, so that all signals transmitted by the antenna 131 can use the conducting layer 19 as a reference ground, thereby improving signal transmission quality.

Figure 4:
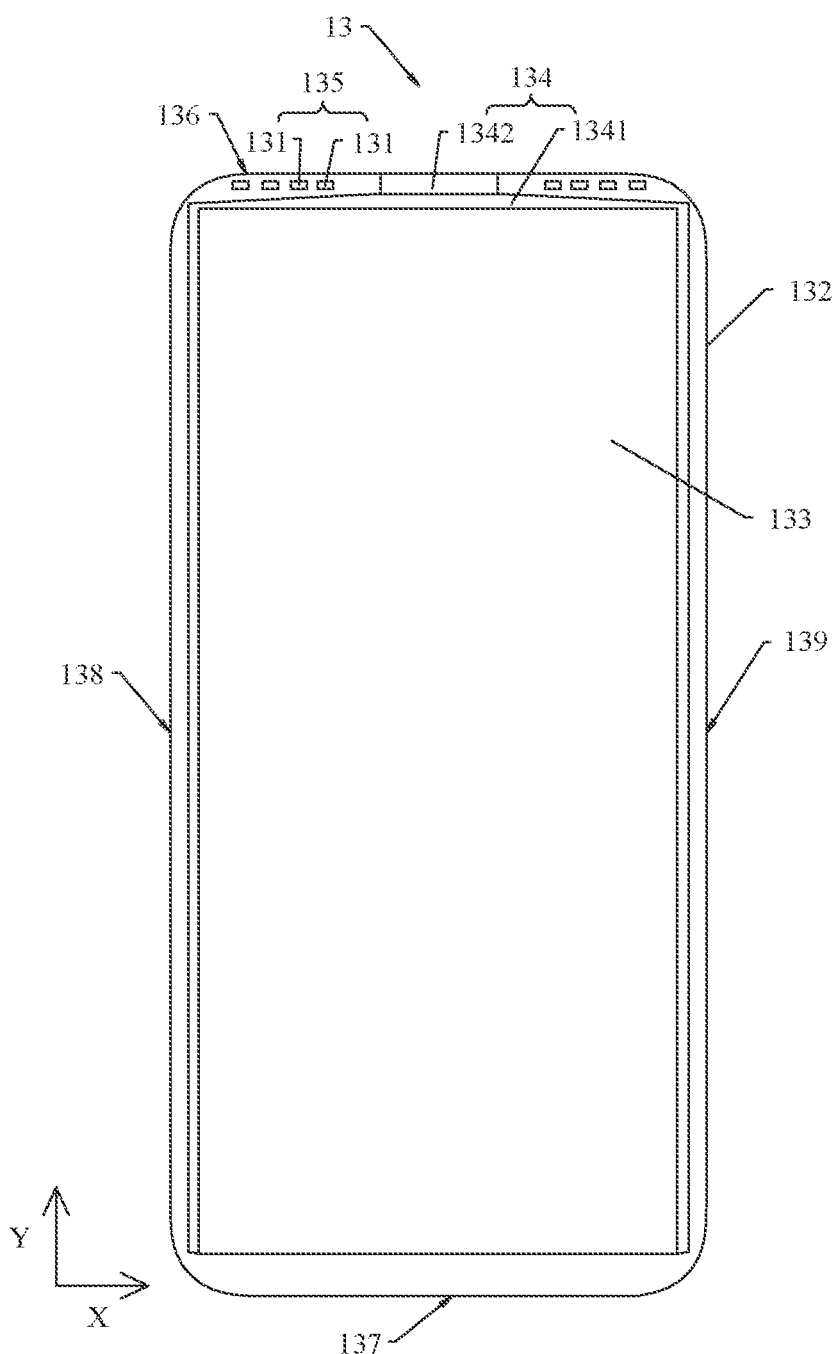
FIG. 4 is a schematic structural diagram of an array substrate shown in FIG. 3 in a first implementation.
Figure 5:
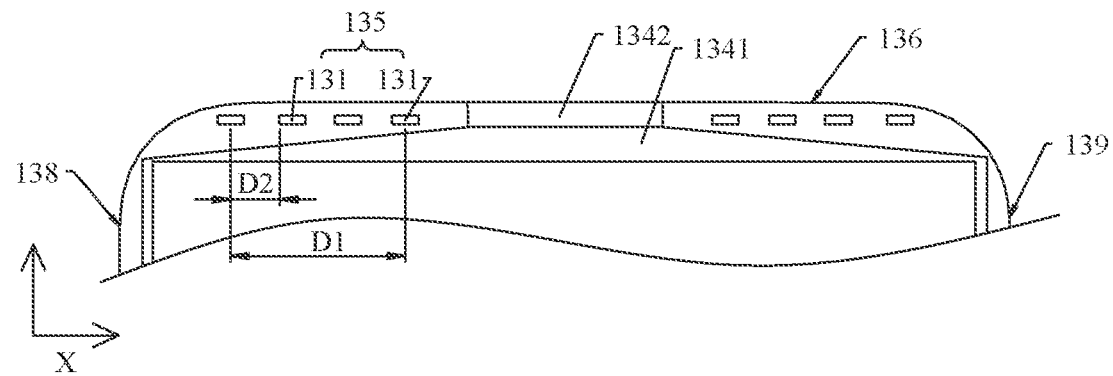
FIG. 5 is an enlarged schematic diagram of a structure shown in FIG. 4.

Further, refer to both FIG. 4 and FIG. 5. FIG. 4 is a schematic structural diagram of the array substrate 13 shown in FIG. 3 in a first implementation. FIG. 5 is an enlarged schematic diagram of a structure shown in FIG. 4. Specifically, FIG. 4 is a top view of the array substrate 13 in FIG. 3 in the first implementation.

The array substrate 13 includes a cable layer 134 and at least one antenna array 135. The antenna array 135 includes a plurality of antennas 131. Because the antenna array 135 includes the plurality of antennas 131, the antenna array 135 may form a multiple-input multiple-output (MIMO) system, to increase a channel capacity, thereby improving communication quality of the antenna 131.

The cable layer 134, the antenna array 135, and the component layer 133 are all located on a same side of the underlying substrate 132, and the antenna array 135 and the cable layer 134 are disposed at intervals, that is, a gap is formed between the antenna array 135 and the cable layer 134. One end of a cable on the cable layer 134 is connected to a thin film transistor on the component layer 133, and the other end of the cable is configured to connect to another component, so that the component is connected to the thin film transistor. The cable layer 134 and the antenna array 135 are disposed at intervals, to prevent a signal transmitted on the cable layer 134 from interfering signal receiving and transmission of the antenna 131 in the antenna array 135.

Further, the cable layer 134 includes a cable exit portion 1342 and a connecting portion 1341. The connecting portion 1341 is connected to the thin film transistor on the component layer 133, and the cable exit portion 1342 is configured to connect to another component. One end of the connecting portion 1341 is connected to the thin film transistor on the component layer 133, and the other end of the connecting portion 1341 is connected to the cable exit portion 1342. For example, the cable exit portion 1342 is configured to connect to a printed circuit board. The printed circuit board is a flexible printed circuit board, so that the printed circuit board can be bent and then connected to a main board located on a side that is of the array substrate 13 and that is away from the cable layer 134 (that is, located below the display 1). The printed circuit board may be fastened to the cable exit portion 1342 in a binding manner.

The cable exit portion 1342 is located between the component layer 133 and a first edge of the underlying substrate 132. The first edge is a top edge 136 or a bottom edge 137 of the underlying substrate 132, that is, the first edge is not a lateral edge of the underlying substrate 132. As shown in FIG. 3, in the first implementation of this application, an example in which the cable exit portion 1342 is located between the component layer 133 and the top edge 136 is used for description, that is, the antenna array 135 is close to the top edge 136 relative to the component layer 133. In another embodiment, the antenna array 135 may be located between the component layer 133 and the bottom edge 137. Alternatively, a part of the antenna array 135 is located between the component layer 133 and the top edge 136, and a part of the antenna array 135 is located between the component layer 133 and the bottom edge 137.

The underlying substrate 132 further includes two lateral edges (138 and 139) located between the top edge 136 and the bottom edge 137. Specifically, the underlying substrate 132 further includes the first lateral edge 138 and the second lateral edge 139 that are disposed opposite to each other. The first lateral edge 138 and the second lateral edge 139 are located between the top edge 136 and the bottom edge 137. Both the first lateral edge 138 and the second lateral edge 139 are lateral edges of the underlying substrate 132. The array substrate 13 includes a scanning line in an X direction and a signal line in a Y direction. The scanning line is led out along a lateral edge of the underlying substrate 132, and the signal line is led out along the first edge of the underlying substrate 132. The connecting portion 1341 includes a connecting portion close to a lateral edge of the underlying substrate 132 and a connecting portion close to the first edge of the underlying substrate 132. The connecting portion close to the lateral edge of the underlying substrate 132 is connected to the scanning line, and the connecting portion close to the first edge of the underlying substrate 132 is connected to the signal line.

In this embodiment, the scanning line is led out from the lateral edge and then converges on a connecting portion of the first edge. To be specific, a part of the connecting portion 1341 is located between the lateral edge of the underlying substrate 132 and the component layer 133, and a part of the connecting portion 1341 is located between the first edge of the underlying substrate 132 and the component layer 133. In addition, the cable exit portion 1342 is located between the first edge of the underlying substrate 132 and the component layer 133. In other words, the cable layer 134 surrounds a periphery of the component layer 133. Correspondingly, both the cable layer 134 and the antenna array 135 are located in the non-display area. The component layer 133 is located in the display area. The non-display area surrounds the display area.

In this implementation, both the cable exit portion 1342 and the antenna array 135 are located between the component layer 133 and the top edge 136. In this way, the cable exit portion 1342 and the antenna array 135 share space in a lateral edge direction of the underlying substrate 132 (an extension direction of the lateral edge of the underlying substrate 132), and a width of the non-display area of the array substrate 13 is reduced, to help increase a screen-to-body ratio and narrow a frame of the display 1 and the terminal device 100.

Further, along an extension direction of the first edge of the underlying substrate 132, the at least one antenna array 135 is located on one side of the cable exit portion 1342 or on two sides of the cable exit portion 1342. The extension direction of the first edge of the underlying substrate 132 is an extension direction of the top edge 136 or an extension direction of the bottom edge 137. As shown in FIG. 3, the X direction is the extension direction of the first edge of the underlying substrate 132, and the Y direction is the extension direction of the lateral edge of the underlying substrate 132.

Specifically, the antenna array 135 is arranged between the cable exit portion 1342 and any lateral edge of the underlying substrate 132. To be specific, the antenna array 135 is arranged between the cable exit portion 1342 and the first lateral edge 138, or the antenna array 135 is arranged between the cable exit portion 1342 and the second lateral edge 139. Alternatively, the antenna array 135 is arranged between the cable exit portion 1342 and each of the two lateral edges of the underlying substrate 132. To be specific, the antenna array 135 is arranged between the cable exit portion 1342 and the first lateral edge 138 and between the cable exit portion 1342 and the second lateral edge 139. As shown in FIG. 5, in this implementation, an example in which the antenna array 135 is partially arranged between the cable exit portion 1342 and the first lateral edge 138 and between the cable exit portion 1342 and the second lateral edge 139 is used for description. In addition, one antenna array 135 is arranged on each of two sides of the cable exit portion 1342.

In this implementation, the antenna array 135 is arranged in idle space on two sides of the cable exit portion 1342, so that the idle space of the array substrate 13 is fully utilized, space utilization of the array substrate 13 is improved, and an integration degree of the array substrate 13 is relatively high. In addition, the antenna array 135 and the cable exit portion 1342 are located on a side close to the top edge 136, so that the non-display area is integrated into the side close to the top edge 136. This prevents the antenna array 135 from being arranged between the lateral edge and the component layer 133, and reduces a width of the non-display area, thereby helping increase a screen-to-body ratio and narrow a frame of the terminal device 100.

Further, in the antenna array 135, a quantity of antennas 131 arranged along the extension direction of the first edge of the underlying substrate 132 is greater than a quantity of antennas 131 arranged along the lateral edge direction of the underlying substrate 132. The extension direction of the first edge of the underlying substrate 132 is defined as a width direction of the underlying substrate 132, and the extension direction of the lateral edge of the underlying substrate 132 is defined as a length direction of the underlying substrate 132. That is, the X direction is the width direction of the underlying substrate 132, and the Y direction is the length direction of the underlying substrate 132. In the antenna array 135, a quantity of antennas 131 arranged along the width direction of the underlying substrate 132 is greater than a quantity of antennas 131 arranged along the length direction of the underlying substrate 132. As shown in FIG. 4, in one antenna array 135, four antennas 131 are arranged along the width direction of the underlying substrate 132, and one antenna 131 is arranged along the length direction of the underlying substrate 132.

Further, in an optional implementation, a length of the antenna affray 135 located on one side of the cable exit portion 1342 is between 18 millimeters and 22 millimeters along the X direction, and is indicated by D1 in FIG. 5. For example, D1 is 20 millimeters. A specific spacing exists between every two antennas 131 in the antenna array 135, to ensure communication quality of each antenna 131. In an optional implementation, the spacing between two adjacent antennas 131 in the antenna array 135 is between 3 millimeters and 5 millimeters, and is indicated by D2 in FIG. 5. For example, D2 is 4 millimeters.

In this implementation, on one hand, because a quantity of antennas 131 arranged in the width direction is greater than a quantity of antennas 131 arranged in the length direction, an area of the non-display area along the length direction is reduced, thereby helping narrow the frame of the terminal device 100. On the other hand, when the terminal device 100 is a mobile phone, a user generally holds a lateral edge of the mobile phone when using the mobile phone, and most of the antennas 131 are arranged in the width direction, to prevent most signals of the antennas 131 from being blocked by a hand of the user, thereby improving signal receiving and transmission performance of the antennas 131.

Figure 6:
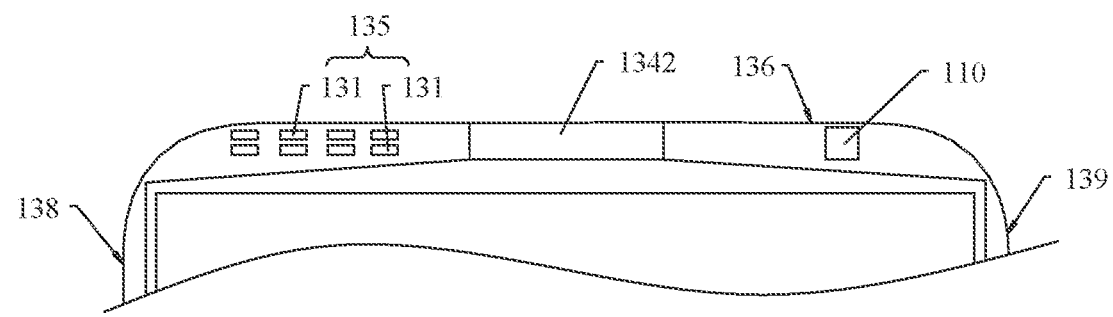
FIG. 6 is a schematic structural diagram of an array substrate shown in FIG. 3 in a second implementation.

Further, FIG. 6 is a schematic structural diagram of the array substrate 13 shown in FIG. 3 in a second implementation. Content of most technical solutions in this implementation that are the same as those in the first implementation is not described in detail again. A difference between the second implementation and the first implementation is as follows:

The antenna array 135 is arranged on one side of the cable exit portion 1342. Idle space on the other side of the cable exit portion 1342 may be used to arrange a transparent area 110 required for installing a camera. Specifically, in this implementation, the antenna array 135 is arranged only between the cable exit portion 1342 and the first lateral edge 138, and the transparent area 110 is provided in an area between the cable exit portion 1342 and the second lateral edge 139. In another implementation, the antenna array 135 may be alternatively arranged only between the cable exit portion 1342 and the second lateral edge 139, and the transparent area 110 is provided in an area between the cable exit portion 1342 and the first lateral edge 138.

In this implementation, one side of the cable exit portion 1342 of the array substrate 13 may be used to arrange the transparent area 110 required by the camera, so that an arrangement position of the camera of the terminal device 100 is a regular position, and conforms to a habit of using the camera by the user, thereby improving experience of using the terminal device 100 by the user.

Figure 7:
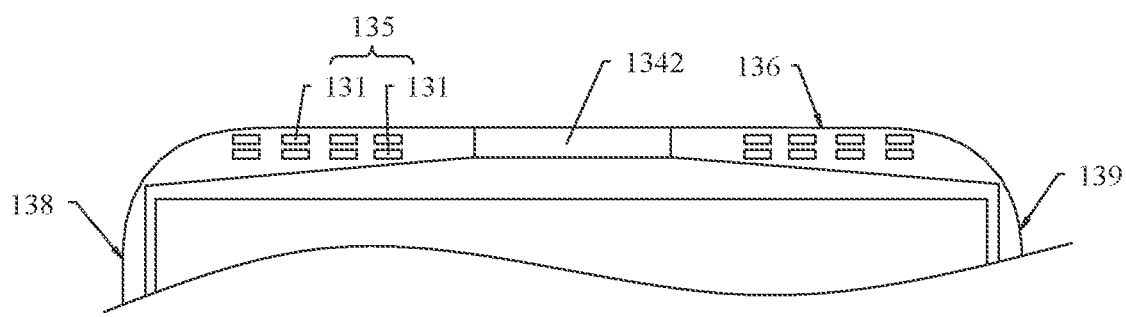
FIG. 7 is a schematic structural diagram of an array substrate shown in FIG. 3 in a third implementation.

Further, FIG. 7 is a schematic structural diagram of the array substrate 13 shown in FIG. 3 in a third implementation. Content of most technical solutions in this implementation that are the same as those in the foregoing implementations is not described in detail again. A difference between the third implementation and the foregoing implementations is as follows:

In this embodiment, the antenna array 135 is provided with at least two antennas 131 in both a width direction and a length direction. A plurality of antennas 131 in the antenna array 135 can form a multiple-input multiple-output system, to increase a channel capacity, thereby improving communication quality of the antennas 131.

Figure 8:
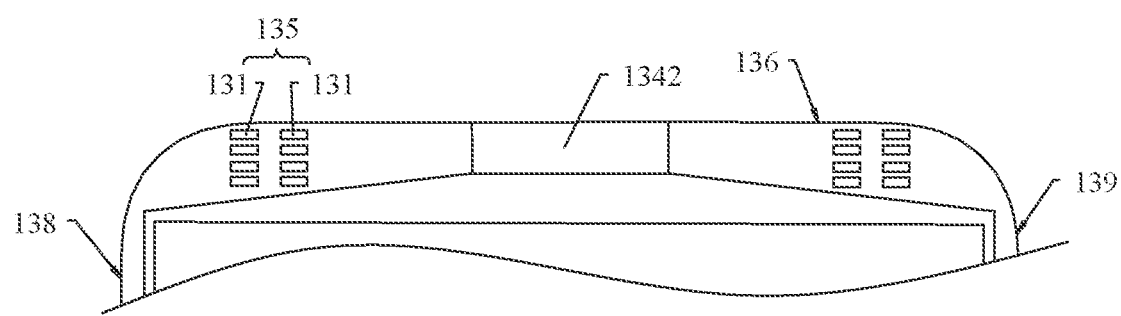
FIG. 8 is a schematic structural diagram of an array substrate shown in FIG. 3 in a fourth implementation.

Further, FIG. 8 is a schematic structural diagram of the array substrate 13 shown in FIG. 3 in a fourth implementation. Content of most technical solutions in this implementation that are the same as those in the foregoing implementations is not described in detail again. A difference between the fourth implementation and the foregoing implementations is as follows:

A quantity of antennas 131 arranged along the width direction of the underlying substrate 132 is less than a quantity of antennas 131 arranged along the length direction of the underlying substrate 132. In this implementation, in the antenna array 135, the quantity of antennas 131 arranged along the width direction of the underlying substrate 132 is relatively small. That is, the antenna array 135 occupies relatively small space on a side of the cable exit portion 1342. Correspondingly, there is more space for arranging other components on the side of the cable exit portion 1342.

Figure 9:
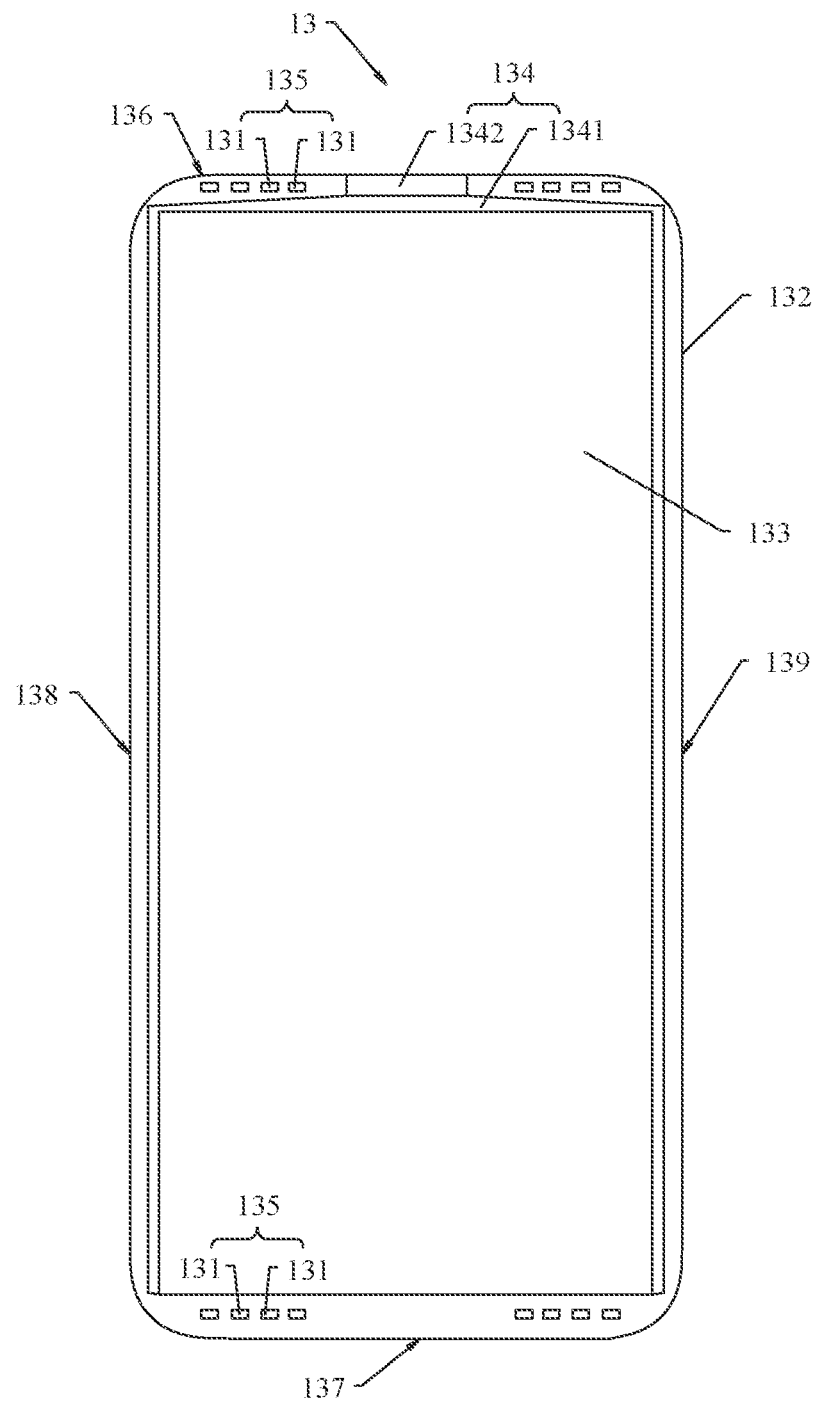
FIG. 9 is a schematic structural diagram of an array substrate shown in FIG. 3 in a fifth implementation.

Further, FIG. 9 is a schematic structural diagram of the array substrate 13 shown in FIG. 3 in a fifth implementation. Content of most technical solutions in this implementation that are the same as those in the foregoing implementations is not described in detail again. A difference between the fifth implementation and the foregoing implementations is as follows:

Apart of the antenna array 135 is arranged between the top edge 136 and the component layer 133, and the other part of the antenna array 135 is arranged between the bottom edge 137 and the component layer 133. As shown in FIG. 9, the antenna array 135 is arranged at four corners of the array substrate 13.

In this implementation, on one hand, the antenna array 135 is disposed on both a side that is of the array substrate 13 and that is close to the top edge 136 and a side that is of the array substrate 13 and that is close to the bottom edge 137, so that a radiation range of the antenna array 135 can be expanded, thereby improving communication quality of the antenna 131. On the other hand, the antenna array 135 is symmetrically arranged on the array substrate 13, so that the non-display area can be symmetrical and an appearance of the display 1 is esthetically symmetrical.

Figure 10:
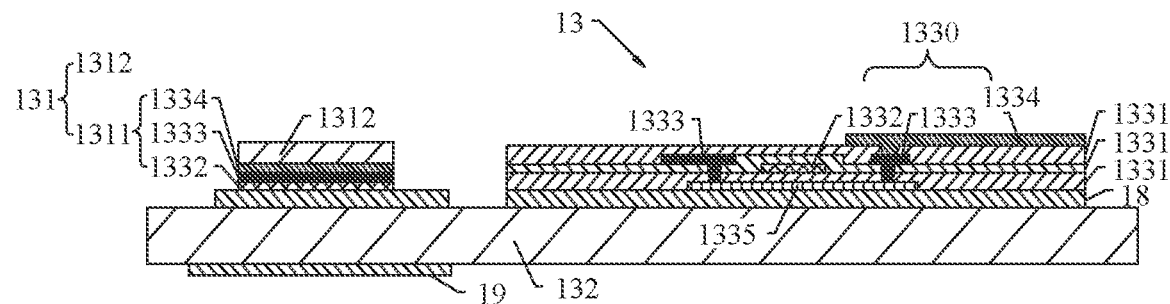
FIG. 10 is a schematic structural diagram of an array substrate shown in FIG. 3 in an implementation.

Further, FIG. 10 is a schematic structural diagram of the array substrate 13 shown in FIG. 3 in an implementation. Specifically, a structure of the array substrate 13 shown in this implementation may be combined with a structure of any array substrate 13 in FIG. 4 to FIG. 9.

The component layer 133 includes a plurality of metal laminates 1330 and a plurality of dielectric laminates 1331 that are stacked. The metal laminates 1330 and the dielectric laminates 1331 are alternately stacked to form a plurality of thin film transistors. At least one dielectric laminate 1331 is disposed between any two adjacent metal laminates 1330. The dielectric laminate 1331 located between the two metal laminates can electrically isolate the two metal laminates from each other. The metal laminate 1330 and the dielectric laminate 1331 are patterned laminates, so that the plurality of metal laminates 1330 and the plurality of dielectric laminates 1331 that are stacked jointly form the plurality of thin film transistors. The plurality of thin film transistors are arranged in an array. In a production process of the thin film transistor, an electronic loop formed by the plurality of metal laminates 1330 and the plurality of dielectric laminates 1331 is stacked on the underlying substrate 132.

The antenna 131 includes a first metal layer 1311. The first metal layer 1311 includes M metal sublayers, where M is an integer greater than or equal to 2. A metal laminate quantity of the plurality of metal laminates 1330 on the component layer 133 is greater than or equal to M. In other words, the quantity of the metal laminates on the component layer 133 is greater than or equal to a quantity of the metal sublayers on the first metal layer 1311 of the antenna 131. The M metal sublayers are sequentially stacked on the underlying substrate 132.

Because M is an integer greater than or equal to 2, the first metal layer 1311 includes at least two metal sublayers. The M metal sublayers include a $j^{th}$ metal sublayer and a $(j+1)^{th}$ metal sublayer. The $j^{th}$ metal sublayer and the $(j+1)^{th}$ metal sublayer are two adjacent metal sublayers on the first metal layer 1311. The M metal sublayers may further include a $(j-i)^{th}$ metal sublayer and a $(j+k)^{th}$ metal sublayer. Both i and j−i are integers greater than or equal to 1, k is an integer greater than or equal to 2, and j+k is an integer less than or equal to M.

A distance between the $j^{th}$ metal sublayer and the underlying substrate 132 is less than a distance between the $(j+1)^{th}$ metal sublayer and the underlying substrate 132, where j is an integer greater than or equal to 1. In other words, the $j^{th}$ metal sublayer is located between the underlying substrate 132 and the $(j+1)^{th}$ metal sublayer. That is, the $(j+1)^{th}$ metal sublayer is a metal sublayer above the $j^{th}$ metal sublayer.

Each metal sublayer corresponds to one of the plurality of metal laminates 1330. In other words, the plurality of metal laminates 1330 have a metal laminate corresponding to each metal sublayer. A distance between a metal laminate corresponding to the $j^{th}$ metal sublayer and the underlying substrate 132 is less than a distance between a metal laminate corresponding to the $(j+1)^{th}$ metal sublayer and the underlying substrate 132. That is, the metal laminate corresponding to the $j^{th}$ metal sublayer is located between the underlying substrate 132 and the metal laminate corresponding to the $(j+1)^{th}$ metal sublayer. In other words, the metal laminate corresponding to the $(j+1)^{th}$ metal sublayer is located above the metal laminate corresponding to the $j^{th}$ metal sublayer.

A deposition technique is used for the array substrate 13 in a technique process. The plurality of metal laminates 1330 on the component layer 133 are formed from bottom to top. In other words, distances between the metal laminates formed in the plurality of metal laminate 1330 from bottom to top and the underlying substrate 132 are in ascending order. For example, a metal laminate that is of the plurality of metal laminates 1330 and that is closest to the array substrate 13 is first formed, and a metal laminate that is of the plurality of metal laminates 1330 and that is farthest from the array substrate 13 is last formed. Therefore, the distance between the metal laminate corresponding to the $j^{th}$ metal sublayer and the underlying substrate 132 is less than the distance between the metal laminate corresponding to the $(j+1)^{th}$ metal sublayer and the underlying substrate 132.

Further, both a material and a thickness of each metal sublayer are the same as those of a corresponding metal laminate. For example, a material and a thickness of the $j^{th}$ metal sublayer are the same as those of the metal laminate corresponding to the $j^{th}$ metal sublayer. Both a material and a thickness of the $(j+1)^{th}$ metal sublayer are the same as those of the metal laminate corresponding to the $(j+1)^{th}$ metal sublayer. Alternatively, both a material and a thickness of a $(j+i)^{th}$ metal sublayer are the same as those of a metal laminate corresponding to the $(j+i)^{th}$ metal sublayer. i is an integer greater than 1, and j+i is an integer less than or equal to M.

In this embodiment of this application, both a material and a thickness of the metal sublayer of the antenna 131 are the same as those of the metal laminate that is on the component layer 133 and that corresponds to the metal sublayer. The metal sublayer and the metal laminate also have a same process sequence, and are same-layer structures that are synchronously formed in a same process, that is, each metal sublayer and a corresponding metal laminate are synchronously formed in a same process. Because each metal sublayer on the first metal layer 1311 of the antenna 131 is synchronously formed in a process of the component layer 133, that is, some or all structures of the antenna 131 and the component layer 133 are synchronously produced, time consumed in an independent technique required for producing the antenna 131 is greatly reduced, and overall production time of the array substrate 13 is shorter and costs are lower.

M is an integer greater than or equal to 2. To be specific, in this embodiment of this application, both a material and a thickness of at least two metal sublayers on the first metal layer 1311 are the same as those of a corresponding metal laminate. The first metal layer 1311 of the antenna 131 has a specific thickness, and one of the plurality of metal laminates 1330 cannot reach the thickness of the first metal layer 1311. Therefore, at least two metal sublayers of the antenna 131 are synchronously formed in a process of the plurality of metal laminates 1330.

A quantity of the metal sublayers of the antenna 131 may be set based on a thickness required for performance of the antenna 131. Specifically, when the metal sublayers of the antenna 131 and some metal laminates of the component layer 133 are synchronously formed, the quantity of the metal sublayers is less than the quantity of the metal laminates of the component layer 133. For example, when the component layer 133 includes three metal laminates, the first metal layer 1311 may include two metal sublayers. When the metal sublayers of the antenna 131 and all metal laminates of the component layer 133 are synchronously formed, the quantity of the metal sublayers is the same as the quantity of the metal laminates of the component layer 133. For example, when the component layer 133 includes three metal laminates, the first metal layer 1311 also includes three metal sublayers.

Further, the antenna 131 further includes a second metal layer 1312. The second metal layer 1312 is stacked on a side that is of the first metal layer 1311 and that is away from the underlying substrate 132. That is, the first metal layer 1311 is located between the second metal layer 1312 and the underlying substrate 132. In other words, the second metal layer 1312 is stacked on the first metal layer 1311.

In this implementation of this application, because a thickness of each of the plurality of metal laminates 1330 is limited, a thickness of the first metal layer 1311 is limited. In the antenna 131, the second metal layer 1312 continues to be stacked on the first metal layer 1311, so that a total thickness of the antenna 131 can be increased. In this way, the total thickness of the antenna 131 meets a receiving and transmission performance requirement, and bandwidth of the antenna 131 is increased and thermal resistance of the antenna 131 is reduced.

Because a processing time of the first metal layer 1311 and a processing time of the metal laminate on the component layer 133 are synchronous, time consumed in a technique of the antenna 131 is only time consumed in a technique for processing the second metal layer 1312. Therefore, overall processing time of the antenna 131 can be reduced, and costs of producing the antenna 131 can be reduced.

Further, materials of the M metal sublayers on the first metal layer 1311 change along with a material of the metal laminate of the component layer 133. The materials of the M metal sublayers may be the same or may be different. A material of the second metal layer 1312 may be the same as or different from a material of the first metal layer 1311. The material of the second metal layer 1312 may be copper (Cu), aluminum (Al), silver (Ag), or magnesium (Mg). For example, the gate electrode layer of the component layer 133 is made of a copper material, and the source/drain electrode layer of the component layer 133 is also made of a copper material. Two metal sublayers on the first metal layer 1311 correspond to the gate electrode layer and the source/drain electrode layer. In this case, materials of the two metal sublayers on the first metal layer 1311 are the same. If the second metal layer 1312 is made of a copper material, the material of the second metal layer 1312 is the same as the material of the first metal layer 1311. When the gate electrode layer of the component layer 133 is made of a copper material, and the source/drain electrode layer of the component layer 133 is made of a chrome material, the two metal sublayers on the first metal layer 1311 correspond to the gate electrode layer and the source/drain electrode layer. In this case, the materials of the two metal sublayers on the first metal layer 1311 are different, and the material of the second metal layer 1312 is not completely the same as the material of the first metal layer 1311.

Further, the second metal layer 1312 can also be formed by using a deposition technique. The deposition technique includes technologically compatible physical vapor deposition (PVD) or chemical vapor deposition (CVD). Forming the plurality of metal laminates 1330 on the component layer 133 by using the deposition technique is a conventional method.

In this embodiment, a technique that is the same as that of the component layer 133 is used for the second metal layer 1312, so that the second metal layer 1312 can be processed by using a device for producing the component layer 133. Another new device does not need to be introduced in a production process of the antenna 131, so that costs of producing the array substrate 13 can be reduced.

A thickness of the second metal layer 1312 is designed based on a difference between a total thickness required for performance of the antenna 131 and a thickness of the M metal sublayers. Different terminal devices 100 have different performance requirements on the antenna 131. Therefore, the total thickness of the antenna 131 varies. In a technique for producing the antenna 131, the second metal layer 1312 is produced after the first metal layer 1311 is produced. Therefore, when a thickness of the first metal layer 1311 is determined, the total thickness of the antenna 131 depends on the thickness of the second metal layer 1312. Therefore, the thickness of the second metal layer 1312 needs to be designed based on the difference between the total thickness required for the performance of the antenna 131 and the thickness of the M metal sublayers. For example, a broadband requirement of the antenna 131 is met only when the total thickness of the antenna 131 is greater than or equal to 1.5 micrometers. When the thickness of the first metal layer 1311 is 1 micrometer, the thickness of the second metal layer 1312 needs to be greater than or equal to 0.5 micrometer.

As shown in FIG. 10, in this implementation, the plurality of metal laminates 1330 include a gate electrode layer 1332, a source/drain electrode layer 1333, and a pixel electrode layer 1334 that are sequentially stacked on the underlying substrate 132. In addition, at least one dielectric laminate 1331 is disposed between the source/drain electrode layer 1333 and the gate electrode layer 1332. At least one dielectric laminate 1331 is disposed between the pixel electrode layer 1334 and the source/drain electrode layer 1333. That is, metal laminates of the plurality of metal laminates 1330 include the gate electrode layer 1332, the source/drain electrode layer 1333, and the pixel electrode layer 1334.

In this implementation, the thin film transistor is a single-gate structure. In addition, the thin film transistor is a top-gate structure. That is, the gate electrode layer 1332 is located on a layer above a semiconductor layer 1335. The semiconductor layer 1335 is located between the gate electrode layer 1332 and the underlying substrate 132. The gate electrode layer 1332 is located between the source/drain electrode layer 1333 and the semiconductor layer 1335.

The metal laminate corresponding to the $j^{th}$ metal sublayer is the gate electrode layer 1332, and the metal laminate corresponding to the $(j+1)^{th}$ metal sublayer is the source/drain electrode layer 1333 or the pixel electrode layer 1334. In this case, the first metal layer 1311 includes two metal sublayers or three metal sublayers.

Alternatively, the metal laminate corresponding to the $j^{th}$ metal sublayer is the source/drain electrode layer 1333, and the metal laminate corresponding to the $(j+1)^{th}$ metal sublayer is the pixel electrode layer 1334. In this case, the first metal layer 1311 includes two metal sublayers.

As shown in FIG. 10, the first metal layer 1311 includes three metal sublayers. The first metal layer 1311 includes a first metal sublayer, a second metal sublayer, and a third metal sublayer that are sequentially stacked on the underlying substrate 132. When a metal laminate corresponding to the first metal sublayer is the gate electrode layer 1332, a metal laminate corresponding to the second metal sublayer is the source/drain electrode layer 1333, and a metal laminate corresponding to the third metal sublayer is the pixel electrode layer 1334.

When j is equal to 1, the metal laminate corresponding to the first metal sublayer is the gate electrode layer 1332, and the metal laminate corresponding to the second metal sublayer is the source/drain electrode layer 1333. When j is equal to 2, the metal laminate corresponding to the second metal sublayer is the source/drain electrode layer 1333, and the metal laminate corresponding to the third metal sublayer is the pixel electrode layer 1334.

In this embodiment, the thin film transistor on the component layer 133 is processed by using a mature technique. The first metal layer 1311 of the antenna 131 is synchronously formed by using a mature technique, to improve production precision of the antenna 131. In a production process of the antenna 131, a process of an existing mature technique does not need to be greatly changed, and the antenna 131 can be synchronously formed only by adjusting a mask structure, thereby reducing difficulty in improving the mature technique and reducing costs of the array substrate 13.

In another implementation, the first metal layer 1311 may also include two metal sublayers, that is, M is equal to 2, and j is equal to 1. Specifically, the first metal layer 1311 includes a first metal sublayer and a second metal sublayer that are sequentially stacked on the underlying substrate 132. There are the following three cases: when a metal laminate corresponding to the first metal sublayer is the gate electrode layer 1332, a metal laminate corresponding to the second metal sublayer is the source/drain electrode layer 1333; when the metal laminate corresponding to the first metal sublayer is the gate electrode layer 1332, the metal laminate corresponding to the second metal sublayer is the pixel electrode layer 1334; or when the metal laminate corresponding to the first metal sublayer is the source/drain electrode layer 1333, the metal laminate corresponding to the second metal sublayer is the pixel electrode layer 1334.

Figure 11:
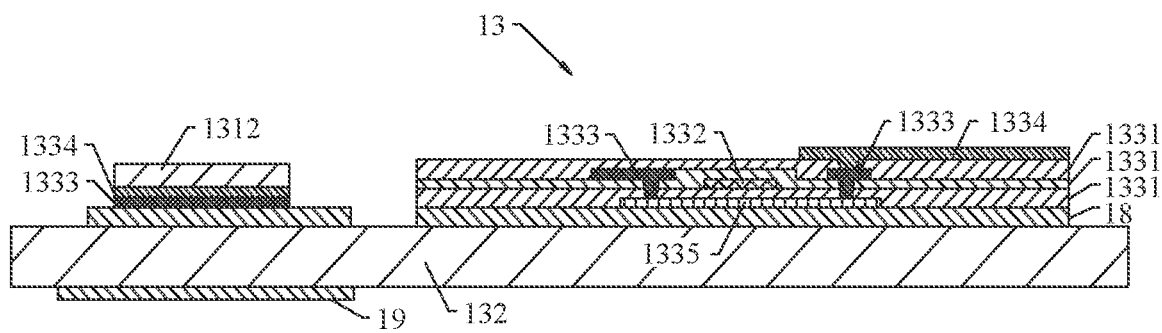
FIG. 11 is a schematic structural diagram of an array substrate shown in FIG. 3 in another implementation.

FIG. 11 is a schematic structural diagram of the array substrate 13 shown in FIG. 3 in another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

The first metal layer 1311 includes two metal sublayers. When a metal laminate corresponding to a first metal sublayer is the source/drain electrode layer 1333, a metal laminate corresponding to a second metal sublayer is the pixel electrode layer 1334.

Figure 12:
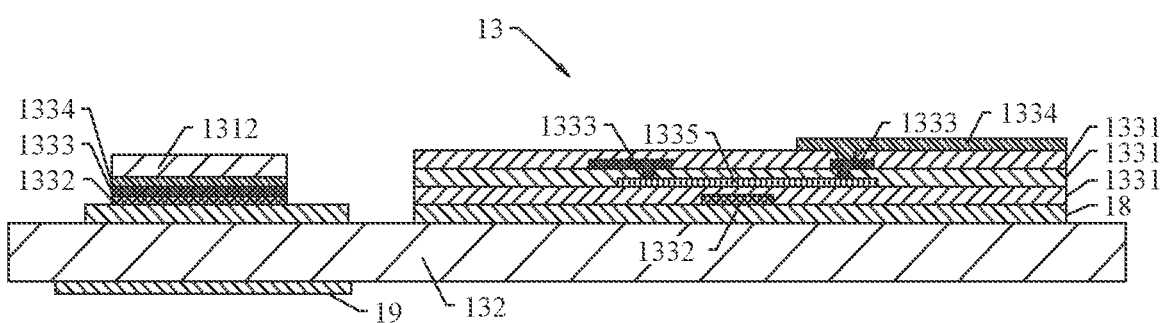
FIG. 12 is a schematic structural diagram of an array substrate shown in FIG. 3 in still another implementation.

FIG. 12 is a schematic structural diagram of the array substrate 13 shown in FIG. 3 in still another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

In this implementation, the thin film transistor is a bottom-gate structure. In other words, the gate electrode layer 1332 is located on a layer below the semiconductor layer 1335. As shown in FIG. 12, the semiconductor layer 1335 is located between the gate electrode layer 1332 and the source/drain electrode layer 1333.

Figure 13:
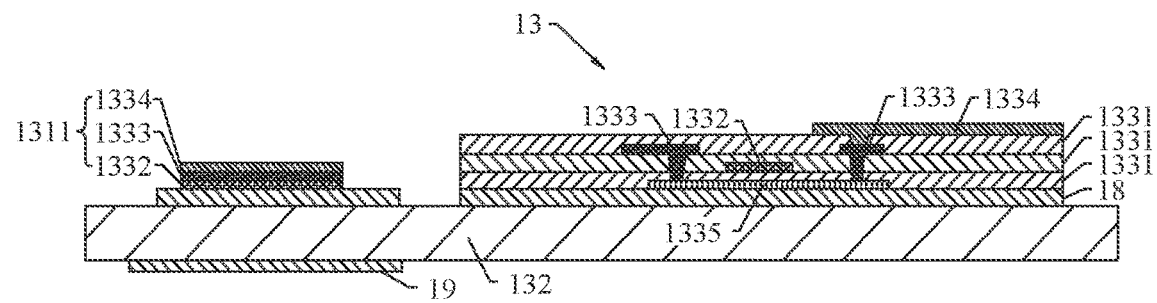
FIG. 13 is a schematic structural diagram of an array substrate shown in FIG. 3 in still another implementation.

Further, FIG. 13 is a schematic structural diagram of the array substrate 13 shown in FIG. 3 in still another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

In this implementation, the antenna 131 does not include the second metal layer 1312. That is, a metal layer of the antenna 131 includes only the first metal layer 1311.

In this implementation, the antenna 131 does not include the second metal layer 1312, and no additional technique is required to form the second metal layer 1312. Time consumed in a technique for processing the metal layer in the antenna 131 and time consumed in a technique for processing the metal laminate on the component layer 133 are synchronous, thereby reducing overall time consumed in a technique of forming the metal layer of the antenna 131.

Figure 14:
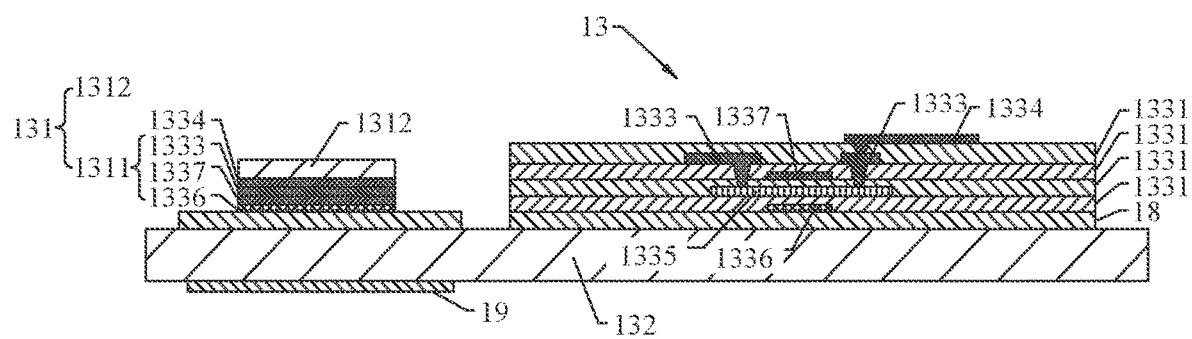
FIG. 14 is a schematic structural diagram of an array substrate shown in FIG. 3 in still another implementation.

FIG. 14 is a schematic structural diagram of the array substrate 13 shown in FIG. 3 in still another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

In this implementation, the plurality of metal laminates 1330 include a first gate electrode layer 1336, a second gate electrode layer 1337, a source/drain electrode layer 1333, and a pixel electrode layer 1334 that are sequentially stacked on the underlying substrate 132. In other words, metal laminates of the plurality of metal laminates 1330 include the first gate electrode layer 1336, the second gate electrode layer 1337, the source/drain electrode layer 1333, and the pixel electrode layer 1334. In this case, the plurality of metal laminates 1330 are at least four metal laminates.

In addition, at least one dielectric laminate 1331 is disposed between the second gate electrode layer 1337 and the first gate electrode layer 1336, at least one dielectric laminate 1331 is disposed between the source/drain electrode layer 1333 and the second gate electrode layer 1337, and at least one dielectric laminate 1331 is disposed between the pixel electrode layer 1334 and the source/drain electrode layer 1333. In this embodiment, the thin film transistor is a double-gate structure. The semiconductor layer 1335 is located between the first gate electrode layer 1336 and the second gate electrode layer 1337.

The metal laminate corresponding to the $j^{th}$ metal sublayer is the first gate electrode layer 1336, and the metal laminate corresponding to the $(j+1)^{th}$ metal sublayer is the second gate electrode layer 1337, the source/drain electrode layer 1333, or the pixel electrode layer 1334. In this case, the first metal layer 1311 may include two metal sublayers, three metal sublayers, or four metal sublayers.

Alternatively, the metal laminate corresponding to the $j^{th}$ metal sublayer is the second gate electrode layer 1337, and the metal laminate corresponding to the $(j+1)^{th}$ metal sublayer is the source/drain electrode layer 1333 or the pixel electrode layer 1334. In this case, the first metal layer 1311 may include two metal sublayers or three metal sublayers.

Alternatively, the metal laminate corresponding to the $j^{th}$ metal sublayer is the source/drain electrode layer 1333, and the metal laminate corresponding to the $(j+1)^{th}$ metal sublayer is the pixel electrode layer 1334. In this case, the first metal layer 1311 includes two metal sublayers.

As shown in FIG. 10, the first metal layer 1311 includes four metal laminates. The first metal layer 1311 includes the first metal sublayer, the second metal sublayer, the third metal sublayer, and the fourth metal sublayer that are sequentially stacked on the underlying substrate 132. When the metal laminate corresponding to the first metal sublayer is the first gate electrode layer 1336, the metal laminate corresponding to the second metal sublayer is the second gate electrode layer 1337, the metal laminate corresponding to the third metal sublayer is the source/drain electrode layer 1333, and the metal laminate corresponding to the fourth metal sublayer is the pixel electrode layer 1334. In this case, the plurality of metal laminates 1330 on the component layer 133 are in a one-to-one correspondence with all the metal sublayers on the first metal layer 1311. M is equal to 4, and j may be equal to 1, 2, or 3.

In this implementation, the first metal layer 1311 includes four metal sublayers on the component layer 133, so that a thickness of the first metal layer 1311 is relatively large. Therefore, a thickness of the second metal layer 1312 is relatively small, and time consumed in a technique for separately producing the second metal layer 1312 can be reduced. In this way, time consumed in a technique for producing the metal layer of the antenna 131 is further reduced, and time consumed in a technique for producing the array substrate 13 is greatly reduced.

In this implementation, a dual-gate structure is used as the thin film transistor. On one hand, the thin film transistor can control the display 1 to display a picture faster, thereby improving quality of the display 1. On the other hand, the dual-gate structure increases a metal laminate quantity of the plurality of metal laminates 1330, thereby increasing options of each metal sublayer on the first metal layer 1311 and enabling the first metal layer 1311 to be thicker after the first metal layer 1311 is formed.

In another implementation, when the first metal layer 1311 includes two metal sublayers, that is, M is equal to 2, the first metal layer 1311 includes a first metal sublayer and a second metal sublayer that are sequentially stacked on the underlying substrate 132. There are the following six cases: when a metal laminate corresponding to the first metal sublayer is the first gate electrode layer 1336, a metal laminate corresponding to the second metal sublayer is the second gate electrode layer 1337; when the metal laminate corresponding to the first metal sublayer is the first gate electrode layer 1336, the metal laminate corresponding to the second metal sublayer is the source/drain electrode layer 1333; when the metal laminate corresponding to the first metal sublayer is the first gate electrode layer 1336, the metal laminate corresponding to the second metal sublayer is the pixel electrode layer 1334; when the metal laminate corresponding to the first metal sublayer is the second gate electrode layer 1337, the metal laminate corresponding to the second metal sublayer is the source/drain electrode layer 1333; when the metal laminate corresponding to the first metal sublayer is the second gate electrode layer 1337, the metal laminate corresponding to the second metal sublayer is the pixel electrode layer 1334; or when the metal laminate corresponding to the first metal sublayer is the source/drain electrode layer 1333, the metal laminate corresponding to the second metal sublayer is the pixel electrode layer 1334.

When the first metal layer 1311 includes three metal sublayers, that is, M is equal to 3, the first metal layer 1311 includes a first metal sublayer, a second metal sublayer, and a third metal sublayer that are sequentially stacked on the underlying substrate 132. There are the following four cases: when a metal laminate corresponding to the first metal sublayer is the first gate electrode layer 1336, a metal laminate corresponding to the second metal sublayer is the second gate electrode layer 1337, and a metal laminate corresponding to the third metal sublayer is the source/drain electrode layer 1333; when the metal laminate corresponding to the first metal sublayer is the first gate electrode layer 1336, the metal laminate corresponding to the second metal sublayer is the source/drain electrode layer 1333, and the metal laminate corresponding to the third metal sublayer is the pixel electrode layer 1334; when the metal laminate corresponding to the first metal sublayer is the first gate electrode layer 1336, the metal laminate corresponding to the second metal sublayer is the second gate electrode layer 1337, and the metal laminate corresponding to the third metal sublayer is the pixel electrode layer 1334, or when the metal laminate corresponding to the first metal sublayer is the second gate electrode layer 1337, the metal laminate corresponding to the second metal sublayer is the source/drain electrode layer 1333, and the metal laminate corresponding to the third metal sublayer is the pixel electrode layer 1334.

Figure 15:
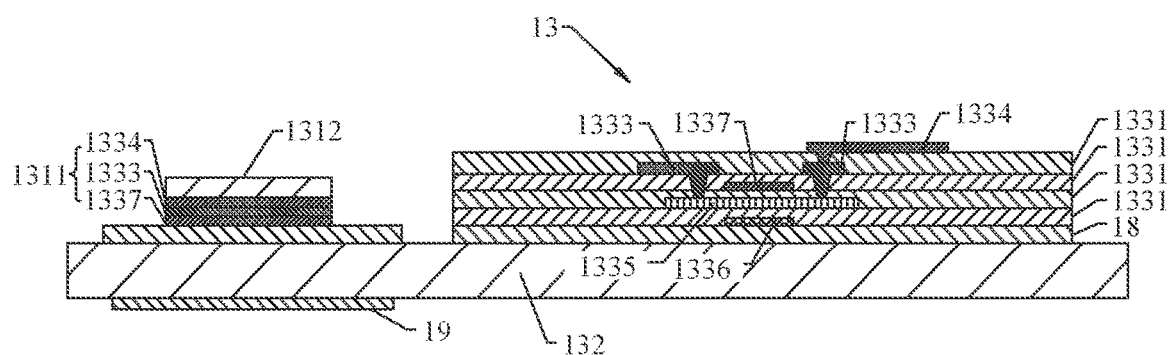
FIG. 15 is a schematic structural diagram of an array substrate shown in FIG. 3 in still another implementation.
Figure 16:
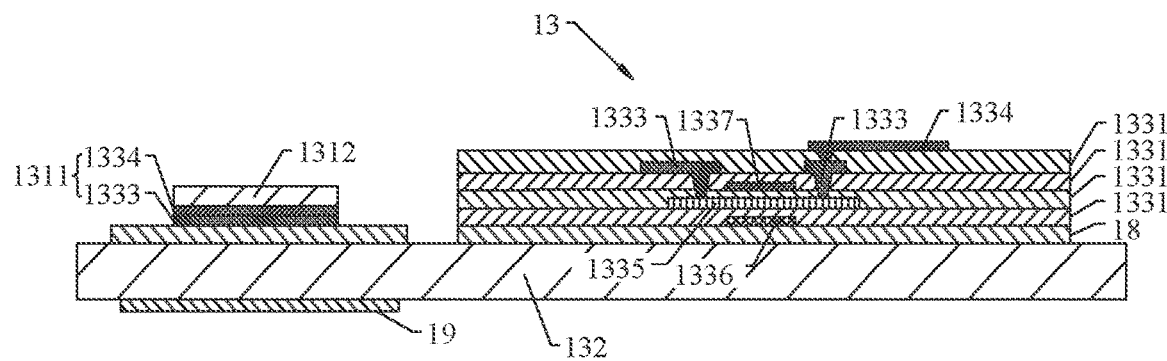
FIG. 16 is a schematic structural diagram of an array substrate shown in FIG. 3 in still another implementation.

Specifically, refer to both FIG. 15 and FIG. 16. FIG. 15 is a schematic structural diagram of the array substrate 13 shown in FIG. 3 in still another implementation. FIG. 16 is a schematic structural diagram of the array substrate 13 shown in FIG. 3 in still another implementation. Most technical solutions of the array substrate 13 shown in FIG. 15 and FIG. 16 that are the same as those of the foregoing array substrate 13 are not described in detail again. A structure of the array substrate 13 shown in this implementation may be combined with a structure of any array substrate 13 in FIG. 4 to FIG. 9.

As shown in FIG. 15, in this implementation, the first metal layer 1311 includes a first metal sublayer, a second metal sublayer, and a third metal sublayer that are sequentially stacked on the underlying substrate 132. When a metal laminate corresponding to the first metal sublayer is the second gate electrode layer 1337, a metal laminate corresponding to the second metal sublayer is the source/drain electrode layer 1333, and a metal laminate corresponding to the third metal sublayer is the pixel electrode layer 1334.

As shown in FIG. 16, in this implementation, the first metal layer 1311 includes a first metal sublayer and a second metal sublayer that are sequentially stacked on the underlying substrate 132. When a metal laminate corresponding to the first metal sublayer is the source/drain electrode layer 1333, the metal laminate corresponding to the second metal sublayer is the pixel electrode layer 1334.

Figure 17:
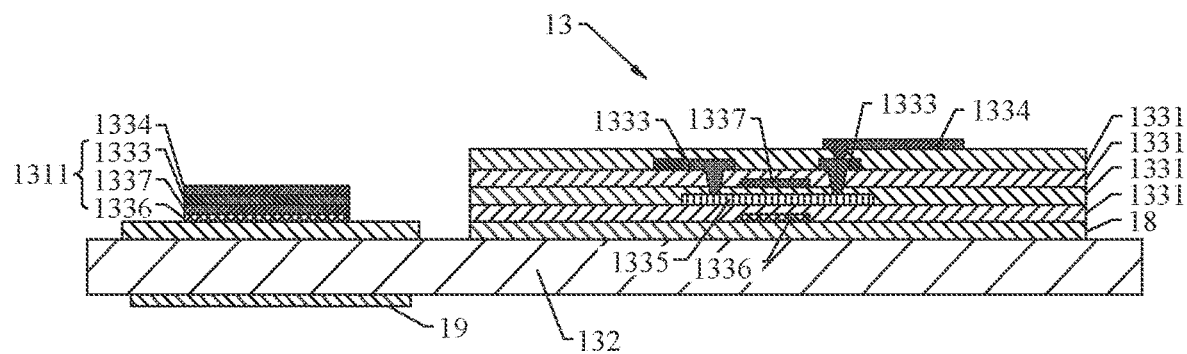
FIG. 17 is a schematic structural diagram of an array substrate shown in FIG. 3 in still another implementation.

Further, FIG. 17 is a schematic structural diagram of the array substrate 13 shown in FIG. 3 in still another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

In this implementation, the antenna 131 does not include the second metal layer 1312. That is, the metal layer of the antenna 131 includes the first metal layer 1311. In this implementation, the antenna 131 does not include the second metal layer 1312, and no additional technique is required to form the second metal layer 1312. Time consumed in a technique for processing the metal layer of the antenna 131 and time consumed in a technique for processing the metal laminate on the component layer 133 are synchronous, thereby reducing overall time consumed in a technique for forming the metal layer of the antenna 131.

Figure 18:
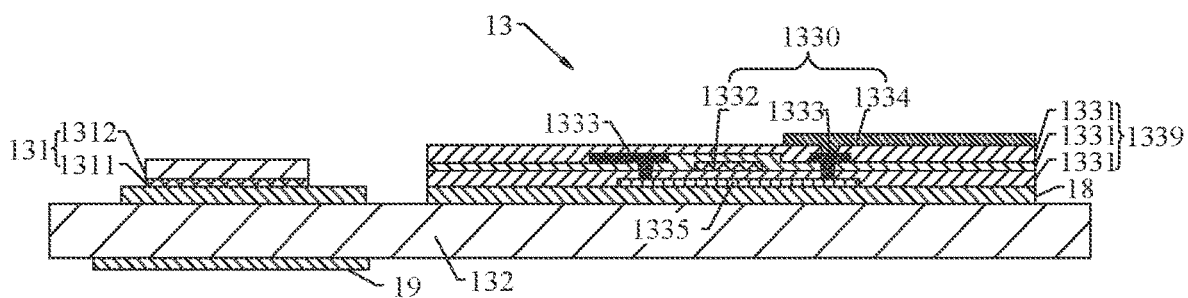
FIG. 18 is a schematic structural diagram of an array substrate shown in FIG. 3 in still another implementation.

Further, FIG. 18 is a schematic structural diagram of the array substrate 13 shown in FIG. 3 in still another implementation. Most technical solutions of the array substrate 13 shown in this implementation that are the same as those of the foregoing array substrate 13 are not described in detail again. A structure of the array substrate 13 shown in this implementation may be combined with a structure of any array substrate 13 in FIG. 4 to FIG. 9.

In this implementation, a thickness and a material of the first metal layer 1311 are the same as those of any one of the plurality of metal laminates 1330. That is, in this implementation, the first metal layer 1311 and only any one of the plurality of metal laminates 1330 are synchronously formed in a same process.

In this implementation, on one hand, the antenna 131 is integrated into the array substrate 13, the antenna 131 can directly perform communication by using space above the display 1, and there is plenty of clearance space of the antenna 131 during communication, so that communication quality of the antenna 131 is relatively desirable. On the other hand, the antenna 131 includes the two metal layers. The first metal layer 1311 and any one of the plurality of metal laminates 1330 on the component layer 133 are synchronously formed, to reduce time consumed in a technique for producing the first metal layer 1311, thereby reducing time consumed in a technique for producing the antenna 131. The second metal layer 1312 increases a thickness of the antenna 131, thereby increasing bandwidth of the antenna 131 and reducing thermal resistance of the antenna 131.

Figure 19:
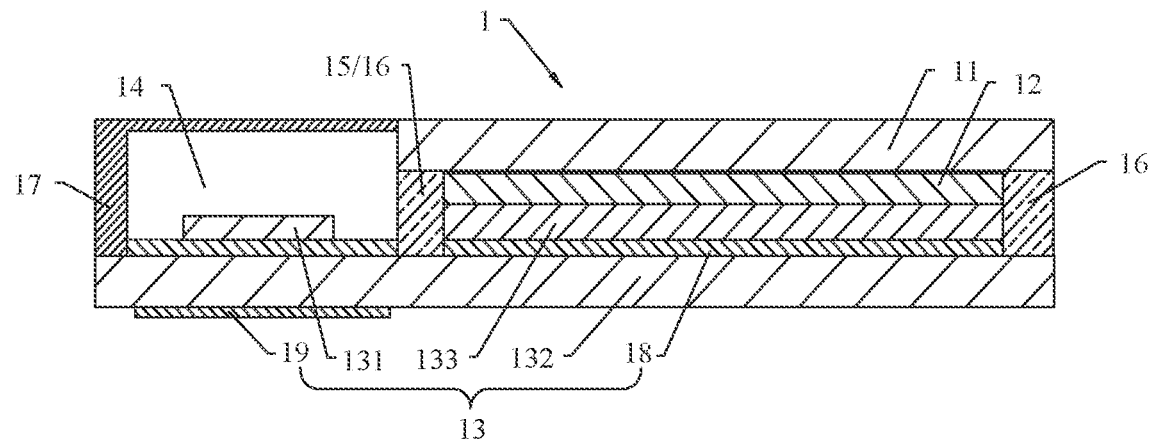
FIG. 19 is a schematic structural diagram of a display of the screen component shown in FIG. 2 according to a second embodiment.

FIG. 19 is a schematic structural diagram of the display 1 of the screen component 10 shown in FIG. 2 according to a second embodiment. Content of most technical solutions in this embodiment that are the same as those in the first embodiment is not described in detail again. A difference between the second embodiment and the first embodiment is as follows:

The aligned substrate 11 and the antenna 131 are arranged in a staggered manner. That is, a projection of the aligned substrate 11 on the underlying substrate 132 does not overlap a projection of the antenna 131 on the underlying substrate 132. The packaging member 17 encloses a periphery of the antenna 131. As shown in FIG. 18, the packaging member 17 is located on a side that is of the antenna 131 and that is away from the component layer 133, and is located on a side that is of the antenna 131 and that is away from the underlying substrate 132.

In this embodiment, the packaging member 17 encloses the antenna 131, to prevent dust or other foreign matters from entering the antenna 131 and affecting performance of the antenna 131. The aligned substrate 11 and the antenna 131 are arranged in a staggered manner, to prevent the aligned substrate 11 from blocking a radiation signal of the antenna 131 and improve communication quality of the antenna 131.

Figure 20:
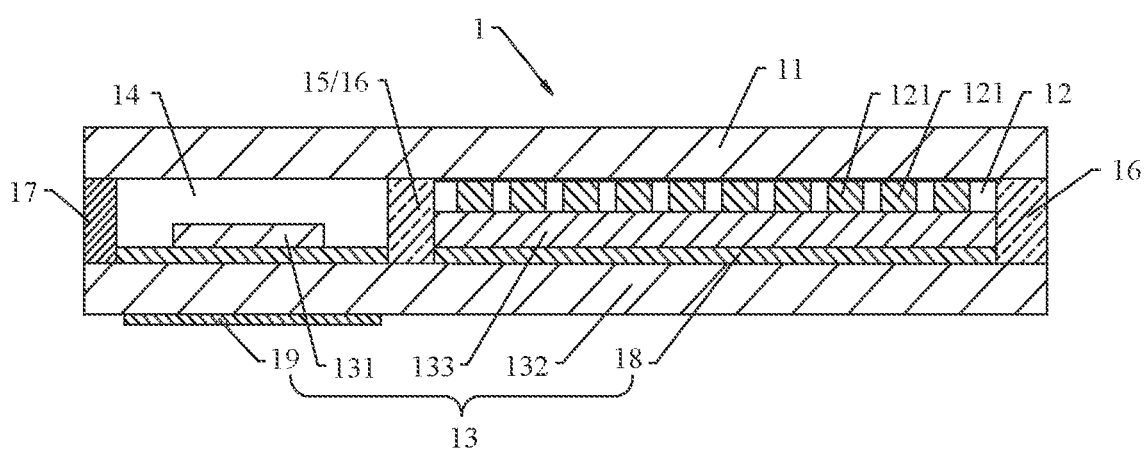
FIG. 20 is a schematic structural diagram of a display of the screen component shown in FIG. 2 according to a third embodiment.

FIG. 20 is a schematic structural diagram of the display 1 of the screen component 10 shown in FIG. 2 according to a third embodiment. Content of most technical solutions in this embodiment that are the same as those in the foregoing embodiments is not described in detail again. A difference between the third embodiment and the foregoing embodiments is as follows:

In this embodiment, the display layer 12 includes light-emitting diodes 121 of a plurality of arrays. In this embodiment, the display 1 is a micro light-emitting diode panel.

In this embodiment, the display has features such as high brightness, high efficiency and low power consumption, an ultra-high resolution and an ultra-high color saturation rate, and a relatively long service life.

Figure 21:
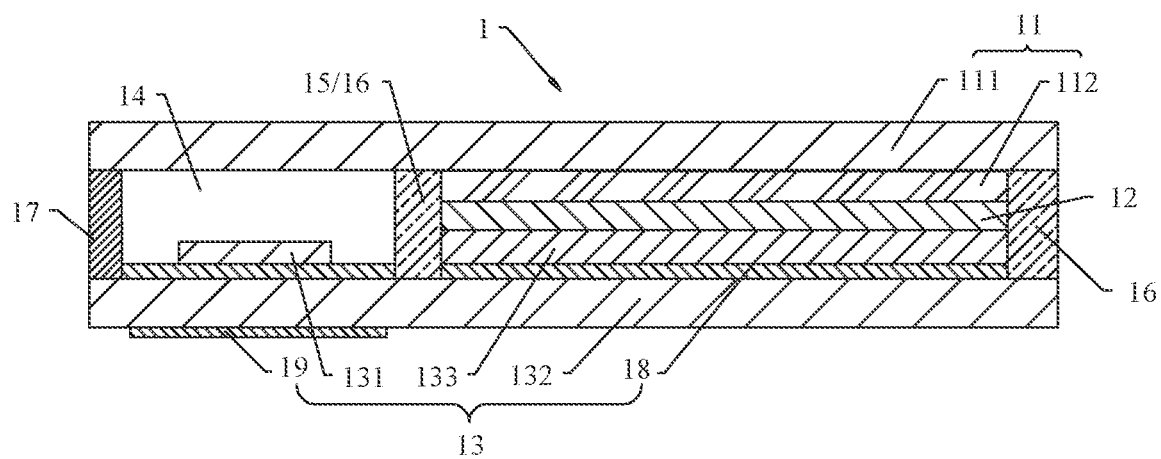
FIG. 21 is a schematic structural diagram of a display of the screen component shown in FIG. 2 according to a fourth embodiment.

FIG. 21 is a schematic structural diagram of the display 1 of the screen component 10 shown in FIG. 2 according to a fourth embodiment. Content of most technical solutions in this embodiment that are the same as those in the foregoing embodiments is not described in detail again.

The aligned substrate 11 includes a base board 111 and a color light filter layer 112. The color light filter layer 5 is located between the base board 111 and the display layer 12. The color light filter layer 112 combines red, green, and blue to generate various colors, to implement color display of the display 1. The color light filter layer 112 has a light filter function, and generally should have characteristics of heat resistance, a high color saturation rate, and desirable penetration.

In this embodiment, the display 1 is a liquid crystal display panel. Correspondingly, the display layer 12 is a liquid crystal layer.

Referring to all of FIG. 4 to FIG. 18, an embodiment further provides another array substrate 13. The array substrate 13 includes an underlying substrate 132, and an antenna 131, a component layer 133, and a cable layer 134 that are located on a same side of the underlying substrate 132. The antenna 131 and the cable layer 134 are disposed at intervals, and a cable on the cable layer 134 is connected to a thin film transistor on the component layer 133. The antenna 131 includes at least two conducting layers. Both a thickness and a material of at least one conducting layer are the same as those of a metal laminate on the component layer 133. The at least one conducting layer includes any metalسublayer of the first metal layer 1311. All the at least two conducting layers may be corresponding metal sublayers on the first metal layer 1311. Alternatively, some of the at least two conducting layers may be corresponding metal sublayers on the first metal layer 1311. In an implementation, there are three conducting layers, and the three conducting layers may be three corresponding metal sublayers on the first metal layer 1311. In another implementation, there are three conducting layers, two conducting layers may be two corresponding metal sublayers on the first metal layer 1311, and the remaining conducting layer is the second metal layer 1312.

In this embodiment, because the antenna 131 is integrated into the array substrate 13, all space above the display 1 may be clearance space of the antenna 131, so that there is plenty of clearance space of the antenna 131 during communication, and communication quality of the antenna 131 is relatively desirable. In addition, both a material and a thickness of a metal sublayer of the antenna 131 are the same as those of the metal laminate that is on the component layer 133 and that corresponds to the metal sublayer. In a production procedure, the metal sublayer and the metal laminate are same-layer structures synchronously formed by using a same process, that is, some or all of the conducting layers of the antenna 131 and the component layer 133 are synchronously produced. In this way, time consumed in a technique for producing the conducting layer of the antenna 131 is reduced, so that overall production time of the array substrate 13 is shorter and costs are lower. The antenna 131 includes the at least two conducting layers. Therefore, a total thickness of the antenna 131 is relatively large, to meet a receiving and transmission performance requirement of the antenna 131, and increase bandwidth of the antenna 131 and reduce thermal resistance of the antenna 131.

Further, the underlying substrate 132 has a display area, a cable area, and an antenna area. The component layer 133 is located in the display area. The cable layer 134 is located in the cable area. The cable area is located between the display area and the top edge 136 of the underlying substrate 132. Alternatively, the cable area is located between the display area and the bottom edge 137 of the underlying substrate 132. The cable area and the antenna area are located in a non-display area.

In this embodiment, the cable area is located between the display area and the top edge 136 or the bottom edge 137, that is, the cable area located in the non-display area is close to the top edge 136 or close to the bottom edge 137, to reduce a width of the display area, thereby helping increase a screen-to-body ratio and narrow a frame of the display 1 and the terminal device 100.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An array substrate, comprising:
   an underlying substrate;
   an antenna; and
   a component layer, wherein a side of the underlying substrate is a first side, and the antenna and the component layer are located on the first side, wherein the component layer and the antenna are disposed at intervals, wherein the component layer comprises a plurality of metal laminates and a plurality of dielectric laminates, wherein the plurality of metal laminates and the plurality of dielectric laminates are alternately disposed to form a plurality of thin film transistors, and wherein the antenna comprises a first metal layer, the first metal layer comprises M metal sublayers sequentially stacked on the underlying substrate, and M is an integer greater than or equal to 2.

2. The array substrate according to claim 1, wherein the M metal sublayers comprise a $j^{th}$ metal sublayer and a $(j+1)^{th}$ metal sublayer, wherein a distance between the $j^{th}$ metal sublayer and the underlying substrate is less than a distance between the $(j+1)^{th}$ metal sublayer and the underlying substrate, and j is an integer greater than or equal to 1, and wherein the $j^{th}$ metal sublayer is located between the underlying substrate and the $(j+1)^{th}$ metal sublayer.

3. The array substrate according to claim 2, wherein each metal sublayer of the M metal sublayers corresponds to one of the plurality of metal laminates, wherein a distance between a metal laminate corresponding to the $j^{th}$ metal sublayer and the underlying substrate is less than a distance between a metal laminate corresponding to the $(j+1)^{th}$ metal sublayer and the underlying substrate.

4. The array substrate according to claim 3, wherein both a material and a thickness of each metal sublayer of the M metal sublayers are the same as those of a corresponding metal laminate.

5. The array substrate according to claim 2, wherein the antenna further comprises a second metal layer, wherein the second metal layer is stacked on a side of the first metal layer that is away from the underlying substrate.

6. The array substrate according to claim 2, wherein the plurality of metal laminates comprise a gate electrode layer, a source/drain electrode layer, and a pixel electrode layer that are sequentially stacked on the underlying substrate, wherein at least one first dielectric laminate is disposed between the source/drain electrode layer and the gate electrode layer, and wherein at least one second dielectric laminate is disposed between the pixel electrode layer and the source/drain electrode layer, and wherein:
   a metal laminate corresponding to the $j^{th}$ metal sublayer is the gate electrode layer, and a metal laminate corresponding to the $(j+1)^{th}$ metal sublayer is the source/drain electrode layer or the pixel electrode layer; or
   the metal laminate corresponding to the $j^{th}$ metal sublayer is the source/drain electrode layer, and the metal laminate corresponding to the $(j+1)^{th}$ metal sublayer is the pixel electrode layer.

7. The array substrate according to claim 2, wherein the plurality of metal laminates comprise a first gate electrode layer, a second gate electrode layer, a source/drain electrode layer, and a pixel electrode layer that are sequentially stacked on the underlying substrate, wherein at least one first dielectric laminate is disposed between the second gate electrode layer and the first gate electrode layer, wherein at least one second dielectric laminate is disposed between the source/drain electrode layer and the second gate electrode layer, and wherein at least one third dielectric laminate is disposed between the pixel electrode layer and the source/drain electrode layer, wherein:
   a metal laminate corresponding to the $j^{th}$ metal sublayer is the first gate electrode layer, and a metal laminate corresponding to the $(j+1)^{th}$ metal sublayer is the second gate electrode layer, the source/drain electrode layer, or the pixel electrode layer;
   the metal laminate corresponding to the $j^{th}$ metal sublayer is the second gate electrode layer, and the metal laminate corresponding to the $(j+1)^{th}$ metal sublayer is the source/drain electrode layer, or the pixel electrode layer; or
   the metal laminate corresponding to the $j^{th}$ metal sublayer is the source/drain electrode layer, and the metal laminate corresponding to the $(j+1)^{th}$ metal sublayer is the pixel electrode layer.

8. The array substrate according to claim 2, wherein:
   the array substrate comprises a cable layer and at least one antenna array comprising a plurality of antennas, wherein the cable layer, the antenna array, and the component layer are all located on a same side of the underlying substrate, and wherein the at least one antenna array and the cable layer are disposed at intervals; and
   a cable exit portion of the cable layer is located between the component layer and a first edge of the underlying substrate, wherein the first edge is a top edge or a bottom edge of the underlying substrate, and wherein the at least one antenna array is located between the component layer and the first edge.

9. The array substrate according to claim 8, wherein along an extension direction of the first edge, the at least one antenna array is located on one side of the cable exit portion or on two sides of the cable exit portion.

10. The array substrate according to claim 2, wherein the array substrate further comprises a conductor layer located on a side of the underlying substrate that is away from the antenna, wherein an area of the conductor layer projected on the underlying substrate is greater than an area of the antenna projected on the underlying substrate.

11. The array substrate according to claim 1, wherein the antenna comprises a second metal layer that is stacked with the first metal layer, wherein the first metal layer is located between the underlying substrate and the second metal layer, and wherein both a thickness and a material of the first metal layer are the same as those of any one of the plurality of metal laminates.

12. A display screen, comprising:
   an aligned substrate;
   a display layer; and
   an array substrate, wherein the aligned substrate is disposed opposite to the array substrate and the display layer is located between the aligned substrate and the array substrate, wherein the array substrate comprises an underlying substrate, an antenna, and a component layer, wherein a side of the underlying substrate is a first side, and the antenna and the component layer are located on the first side, wherein the component layer and the antenna are disposed at intervals, wherein the component layer comprises a plurality of metal laminates and a plurality of dielectric laminates, wherein the plurality of metal laminates and the plurality of dielectric laminates are alternately disposed to form a plurality of thin film transistors, and wherein the antenna comprises a first metal layer, the first metal layer comprises M metal sublayers sequentially stacked on the underlying substrate, and M is an integer greater than or equal to 2.

13. The display screen according to claim 12, comprising an insulation layer located between the aligned substrate and the antenna.

14. The display screen according to claim 12, further comprising a packaging frame connected between the underlying substrate and the aligned substrate and disposed around the component layer, wherein the display layer is located on an inner side of the packaging frame, and wherein the antenna is located on an outer side of the packaging frame.

15. A terminal device, comprising:
   a housing; and
   a display screen, wherein the display screen is mounted on the housing, wherein the display screen comprises an aligned substrate, a display layer, and an array substrate, wherein the aligned substrate is disposed opposite to the array substrate and the display layer is located between the aligned substrate and the array substrate, wherein the array substrate comprises an underlying substrate, an antenna, and a component layer, wherein a side of the underlying substrate is a first side, and the antenna and the component layer are located on the first side, wherein the component layer and the antenna are disposed at intervals, wherein the component layer comprises a plurality of metal laminates and a plurality of dielectric laminates, wherein the plurality of metal laminates and the plurality of dielectric laminates are alternately disposed to form a plurality of thin film transistors, and wherein the antenna comprises a first metal layer, the first metal layer comprises M metal sublayers sequentially stacked on the underlying substrate, and M is an integer greater than or equal to 2.

* * * * *

UNITED STATES PATENT AND TRADEMARK OFFICE
CERTIFICATE OF CORRECTION

| | | |
|---|---|---|
| PATENT NO. | : 12,100,715 B2 | Page 1 of 1 |
| APPLICATION NO. | : 17/158664 | |
| DATED | : September 24, 2024 | |
| INVENTOR(S) | : Huajun Cao et al. | |

It is certified that error appears in the above-identified patent and that said Letters Patent is hereby corrected as shown below:

On the Title Page

In Column 2 (Item (57) Abstract), In Line 2, Delete "antenna" and insert -- antenna, --.

Signed and Sealed this
Tenth Day of December, 2024

Katherine Kelly Vidal
*Director of the United States Patent and Trademark Office*